(12) United States Patent
Misawa

(10) Patent No.: US 9,013,234 B2
(45) Date of Patent: Apr. 21, 2015

(54) TRANSCONDUCTANCE ADJUSTMENT CIRCUIT, CIRCUIT DEVICE, AND ELECTRONIC APPARATUS

(71) Applicant: Seiko Epson Corporation, Tokyo (JP)

(72) Inventor: Toshiyuki Misawa, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/859,688

(22) Filed: Apr. 9, 2013

(65) Prior Publication Data

US 2013/0265106 A1    Oct. 10, 2013

(30) Foreign Application Priority Data

Apr. 10, 2012  (JP) ................................. 2012-089063

(51) Int. Cl.
| | |
|---|---|
| H03K 5/00 | (2006.01) |
| H03H 11/04 | (2006.01) |
| H03F 1/32 | (2006.01) |
| H03F 1/22 | (2006.01) |
| H03F 3/21 | (2006.01) |
| H03F 3/45 | (2006.01) |
| H03H 7/01 | (2006.01) |

(52) U.S. Cl.
CPC ......... *H03H 11/0466* (2013.01); *H03F 1/3211* (2013.01); *H03H 11/0472* (2013.01); *H03F 1/223* (2013.01); *H03F 3/211* (2013.01); *H03F 3/45183* (2013.01); *H03F 3/45197* (2013.01); *H03F 3/45475* (2013.01); *H03H 2007/0192* (2013.01); *H03F 2200/294* (2013.01); *H03F 2200/453* (2013.01); *H03F 2203/45366* (2013.01); *H03F 2203/45512* (2013.01); *H03F 2203/45594* (2013.01); *H03F 2203/45644* (2013.01); *H03F 2203/45674* (2013.01); *H03F 2203/45702* (2013.01)

(58) Field of Classification Search
USPC .................................................. 327/551–559
See application file for complete search history.

(56) References Cited

U.S. PATENT DOCUMENTS

| | | | | |
|---|---|---|---|---|
| 6,262,624 | B1 * | 7/2001 | Tsinker ......................... | 327/553 |
| 7,051,063 | B2 * | 5/2006 | Kaczynski et al. ........... | 708/819 |
| 7,180,364 | B2 | 2/2007 | Kimura | |
| 7,319,731 | B2 | 1/2008 | Wu | |

(Continued)

FOREIGN PATENT DOCUMENTS

| | | |
|---|---|---|
| JP | 08-204504 A | 8/1996 |
| JP | 2003-142987 A | 5/2003 |
| JP | 2008-167000 A | 7/2008 |

(Continued)

*Primary Examiner* — Dinh Le
(74) *Attorney, Agent, or Firm* — Kilpatrick Townsend & Stockton LLP

(57) ABSTRACT

A transconductance adjustment circuit includes a reference signal generation circuit that outputs a first signal and a second signal that is different by 90 degrees in phase from the first signal, a replica circuit to which the first signal and the second signal are input and which generates a first output signal and a second output signal, and an adjustment signal generation circuit that outputs a transconductance adjustment signal with respect to the adjustment-targeted circuit and the replica circuit. The reference signal generation circuit generates the first signal and the second signal that change in voltage at between a first voltage level and a second voltage level, based on a clock signal, and outputs the generated first and second signals with respect to the replica circuit.

20 Claims, 20 Drawing Sheets

(56) References Cited

U.S. PATENT DOCUMENTS

| | | |
|---|---|---|
| 7,974,376 B2 | 7/2011 | Wu |
| 8,279,639 B2 | 10/2012 | Sakakibara |
| 2005/0168274 A1 | 8/2005 | Kimura |

FOREIGN PATENT DOCUMENTS

| | | |
|---|---|---|
| JP | 2009-077616 A | 4/2009 |
| JP | 2012-195759 A | 10/2012 |
| WO | 2009/028412 A1 | 3/2009 |

* cited by examiner

TRANSCONDUCTANCE ADJUSTMENT CIRCUIT, CIRCUIT DEVICE, AND ELECTRONIC APPARATUS

This application claims priority to Japanese Patent Application No. 2012-089063, filed Apr. 10, 2012, the entirety of which is hereby incorporated by reference.

BACKGROUND

1. Technical Field

The present invention relates to a transconductance adjustment circuit, a circuit device, and an electronic apparatus.

2. Related Art

With the spread of portable wireless apparatuses in recent years, a wireless circuit device has been demanded that is smaller in size and low in power consumption. For example, the wireless circuit device has been realized on one chip, by using a complex band pass filter (a complex BPF) circuit configured from an operational transconductance amplifier (OTA) and a capacitor, as a filter circuit.

However, because a characteristic variation in a transconductance and a passive element due to variations in the IC manufacturing process and variations in power source voltage, temperature, and the like cannot be avoided, there is a problem in that a variation in a characteristic of a filter occurs and as a result, operation of the wireless apparatus is unstable.

With regard to this problem, techniques for compensating for the variations in the characteristic of the filter by adjusting the transconductance of OTA are disclosed in U.S. Pat. No. 7,319,731, JP-A-8-204504, and JP-A-2003-142987. However, the techniques are problematic in that the degree to which a phase error of the complex BPF circuit is detected is insufficient and it is difficult to compensate for the variation in the characteristic of the filter with high precision.

SUMMARY

An advantage of some aspects of the invention is to provide a transconductance adjustment circuit, a circuit device, an electronic apparatus, and the like that can adjust the transconductance with high precision by employing a simple configuration.

An aspect of the invention is directed to a transconductance adjustment circuit including a reference signal generation circuit that outputs a first signal and a second signal that is different by 90 degrees in phase from the first signal, a replica circuit of an adjustment-targeted circuit, to which the first signal and the second signal are input and which generates a first output signal and a second output signal, and an adjustment signal generation circuit that outputs a transconductance adjustment signal to the adjustment-targeted circuit and the replica circuit, in which the reference signal generation circuit generates the first signal and the second signal that change in voltage at between a first voltage level and a second voltage level, based on a clock signal, and outputs the generated first signal and second signal to the replica circuit.

According to the aspect of the invention, the reference signal generation circuit may set a phase difference between the first and second signals precisely to 90 degrees because timings of the first and second signals can be generated based on a clock signal. As a result, the performance of adjustment of transconductance with high precision becomes possible with the simple circuit configuration.

In the aspect of the invention, an amplitude of the first signal and an amplitude of the second signal may be half or less of an amplitude of the clock signal.

With this configuration, because the amplitude of the first signal and the amplitude of the second signal can be sufficiently decreased, it is possible to decrease a distortion and a noise component that has a bad influence on the adjustment-targeted circuit.

In the aspect of the invention, the reference signal generation circuit may include a signal generation circuit that generates a first square wave signal to an n-th (n is an integer equal to or greater than 2) square wave signal that are different in phase, based on the clock signal, and a voltage level conversion circuit, to which the first square wave signal to the n-th square wave signal are input, and which outputs the first signal and the second signal by performing conversion processing on a voltage level.

With this configuration, because the signal generation circuit generates the n square wave signals that have a phase difference with high precision and the voltage level conversion circuit performs conversion processing on a voltage level of the square wave signal, the phase difference between the first and second signals can be set precisely to 90 degrees.

In the aspect of the invention, the signal generation circuit may include a divider that divides the clock signal to output a divided signal, and a shift resister that outputs the first square wave signal to the n-th square wave signal by shifting the divided signal with the clock signal.

With this configuration, the signal generation circuit can generate the n square wave signals that have the phase difference with high precision.

In the aspect of the invention, the voltage level conversion circuit may include a resistors chained circuit that generates the first voltage level and the second voltage level, and a switch circuit which is turned on and turned off based on the first square wave signal to the n-th square wave signal, and which alternately selects the first voltage level and the second voltage level, and the switch circuit may generate and output the first signal and the second signal, by alternately selecting the first voltage level and the second voltage level.

With this configuration, the voltage level conversion circuit can output the first and second signals that change in voltage at between the first voltage level and the second voltage level and furthermore are different precisely by 90 degrees in phase, by setting the first and second voltage levels using the resistors chained circuit and by alternately selecting the first and second voltage levels using the switch circuit.

In the aspect of the invention, the voltage level conversion circuit includes an attenuator that attenuates the first square wave signal to the n-th square wave signal to obtain attenuated signals, and a level shift circuit that generates and outputs the first signal and the second signal, by shifting a voltage level of the attenuated signals.

With this configuration, the voltage level conversion circuit can output the first and second signals that change in voltage at between the first voltage level and the second voltage level and furthermore are different precisely by 90 degrees in phase, by attenuating the first square wave signal to the n-th square wave signal using the attenuator and by shifting the voltage level of the signal attenuated by the attenuator.

In the aspect of the invention, the adjustment-targeted circuit may be a first complex band pass filter circuit, and the replica circuit may include a second complex band pass filter circuit.

With this configuration, a characteristic of a band pass filter in the adjustment-targeted circuit can be adjusted by adjusting a characteristic of the band pass filter in the replica circuit.

In the aspect of the invention, the replica circuit may include a first resistor element that is provided between a first input node to which the first signal is input and a first output node, a second resistor element that is provided between a second input node to which the second signal is input and a second output node, a first capacitor one terminal of which is connected to the first output node, a second capacitor one terminal of which is connected to the second output node, and a center frequency shift circuit that is configured from a pair of operational transconductance amplifiers provided between the first output node and the second output node.

With this configuration, because the replica circuit makes up the first complex band pass filter circuit, the center frequency can be adjusted by adjusting the transconductance of the operational transconductance amplifier.

In the aspect of the invention, the adjustment signal generation circuit may generate the transconductance adjustment signal, based on the second signal and the first output signal output from the first output node, or on the first signal and the second output signal output from the second output node, or on the first signal and the first output signal, or on the second signal and the second output signal.

With this configuration, for example, the transconductance of the adjustment-targeted circuit can be adjusted by detecting the phase difference, for example, between the second signal and the first output signal, and outputting the transconductance adjustment signal based on the detected phase difference. As a result, for example, in the adjustment-targeted circuit, such as a complex filter circuit, a variation in the characteristic of the filter due to variations in the IC manufacturing process and variations in power source voltage, temperature and the like can be compensated for, with high precision.

In the aspect of the invention, the adjustment signal generation circuit may include a mixer to which the first signal and the second output signal are input, or the second signal and the first output signal are input, a first smoothing circuit that smooths a first mixer output signal from the mixer, a second smoothing circuit that smooths a second mixer output signal from the mixer, an integrator circuit that integrates output signals of the first smoothing circuit and the second smoothing circuit and generates a first integrated voltage and a second integrated voltage, a compensation electric current generation circuit that generates a compensation electric current based on the first integrated voltage and the second integrated voltage from the integrator circuit, a reference bias electric current generation circuit that generates a reference bias electric current, and an electric current addition circuit that adds the compensation electric current and the reference bias electric current, and the adjustment signal generation circuit may output the transconductance adjustment signal, based on an electric current added by the electric current addition circuit.

With this configuration, the phase difference between the two signals can be detected with high precision, because the amount of fluctuation in the signal level due to the variations in the IC manufacturing process and the variations in power source voltage, temperature, and the like that derive from the mixer can be taken out by generating the first and second integrated voltages, based on the first and second mixer output signals that are differential signals, and generating a compensation electric current, based on the difference between the first and second integrated voltages. As a result, for example, the transconductance of the adjustment-targeted circuit can be adjusted with high precision.

In the aspect of the invention, the adjustment signal generation circuit may include a mixer to which the first signal and the second output signal are input, or the second signal and the first output signal are input, a smoothing circuit that smooths an output of the mixer, a differential signal generation circuit that generates a differential signal between an output signal of the smoothing circuit and a reference voltage signal, an integrator circuit that integrates the differential signal from the differential signal generation circuit and generates a integrated voltage, a compensation electric current generation circuit that generates a compensation electric current, based on the integrated voltage from the integrator circuit, a reference bias electric current generation circuit that generates a reference bias electric current, and an electric current addition circuit that adds the compensation electric current and the reference bias electric current, and the adjustment signal generation circuit may output the transconductance adjustment signal, based on an electric current added by the electric current addition circuit.

With this configuration, the phase difference between the two signals can be detected with high precision, because the amount of fluctuation in the signal level due to the variations in the IC manufacturing process and the variations in power source voltage, temperature, and the like that derive from the mixer can be taken out by the smoothing circuit, for example, outputting the voltage level according to the phase difference between the first signal and the second output signal, and by the differential signal generation circuit generating the differential signal between the output signal of the smoothing circuit and the reference voltage signal. As a result, for example, the transconductance of the adjustment-targeted circuit can be adjusted with high precision.

In the aspect of the invention, the reference signal generation circuit may output a third signal that is different in phase from the first signal and the second signal, and the adjustment signal generation circuit may output a signal that adjusts a resistor value with respect to the first resistor element, the second resistor element and the adjustment-targeted circuit, based on the third signal and the first output signal, or on the third signal and the second output signal.

With this configuration, the characteristic, such as a bandwidth of the complex band pass filter can be compensated because the resistor value of the resistor element included in the adjustment-targeted circuit can be adjusted, for example, based on the third signal and the first output signal.

Another aspect of the invention is directed to a circuit device including any one of the transconductance adjustment circuits described above, and the adjustment-targeted circuit.

In the another aspect of the invention, the adjustment-targeted circuit may be a complex band pass filter circuit that has an operational transconductance amplifier, and transconductance of the operational transconductance amplifier may be adjusted based on the transconductance adjustment signal.

With this configuration, the deviation of the characteristic of the band pass filter can be compensated with high precision by adjusting the transconductance of the operational transconductance amplifier of a complex band pass filter circuit. As a result, for example, robust wireless communication can be realized in a more stable manner in the circuit device, such as a wireless circuit.

Still another aspect of the invention is directed to an electronic apparatus including the circuit device described above.

BRIEF DESCRIPTION OF THE DRAWINGS

The invention will be described with reference to the accompanying drawings, wherein like numbers reference like elements.

DESCRIPTION OF EXEMPLARY EMBODIMENTS

A suitable embodiment according to the invention is described below in detail. The embodiment described below does not improperly limit the subjects of the invention described in the appended claims, and does not limit all configurations described according to the embodiment, as being necessarily indispensable for a solution according to the invention.

1. Complex Band Pass Filter

A transconductance adjustment circuit according to the embodiment is a circuit that adjusts a frequency characteristic of a complex band pass filter (a complex BPF). First, a principle of the complex BPF is described. Moreover, the operational principle of the complex BPF circuit is disclosed in detail in a publication, Pietro Andreani "A CMOS gm-C Polyphase Filter with High Image Band Rejection" ESSCIRC 2000 (26th European Solid-State Circuits Conference).

Figure 1A:
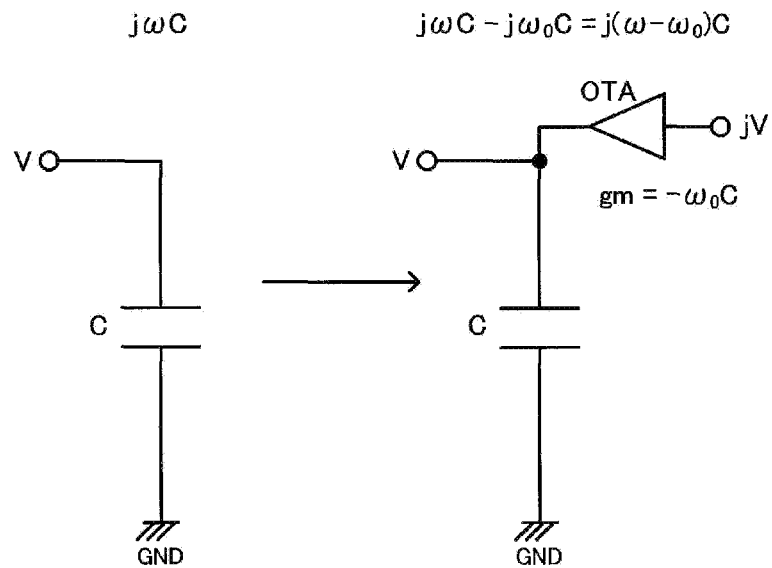
FIGS. 1A and 1B are a diagram and a graph, each illustrating a principle of a center frequency shift circuit.
Figure 1B:
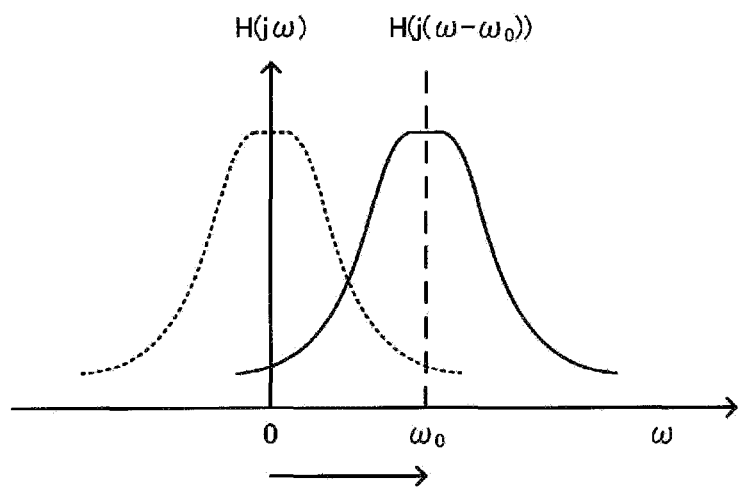

FIGS. 1A and 1B are diagrams illustrating a principle of a center frequency shift circuit used in the complex BPF. Moreover, FIGS. 1A and 1B are disclosed in the publication described above. As illustrated in FIG. 1A, an electric current $j \cdot \omega \cdot C \cdot V$ flows through a capacitor because in a case where an alternating current voltage V with a frequency $\omega$ is applied to a capacitor with a capacity C, a conductance is given $j \cdot \omega \cdot C$ (j is an imaginary number). Next, an operational transconductance amplifier (OTA) is connected to the capacitor, and an alternating current voltage jV, which is different by 90 degrees in phase from V, is input via OTA. A transconductance gm of OTA is $-\omega 0 \cdot C$. As a result, an electric current $j \cdot (\omega - \omega 0) \cdot C \cdot V$ flows through the capacitor in a circuit on the right-hand side of FIG. 1A, and the circuit seemingly behaves in such a manner that the conductance is $j \cdot \omega \cdot C - j \cdot \omega 0 \cdot C = j \cdot (\omega - \omega 0) \cdot C$. That is, the circuit shows the same response as in a case where a frequency is shifted only by $\omega 0$ in the original circuit. In this manner, a characteristic of the frequency being shifted only by $\omega 0$ may be obtained by inputting the alternating current voltage V directly and further inputting the alternating current voltage jV, which is different by 90 degrees in phase from V, via OTA, with respect to the capacitor. A configuration example of OTA is described below.

FIG. 1B is a diagram illustrating the frequency characteristic in a case where the center frequency shift circuit is applied to a low pass filter. The center frequency of the low pass filter may be shifted only by $\omega 0$, by connecting $gm = -\omega 0 \cdot C$ of OTA and inputting a signal that is different by 90 degrees in phase from an input signal, via OTA, with respect to all the capacitors included in the low pass filter. As a result, the band pass filter with the center frequency $\omega 0$ may be obtained.

Figure 2A:
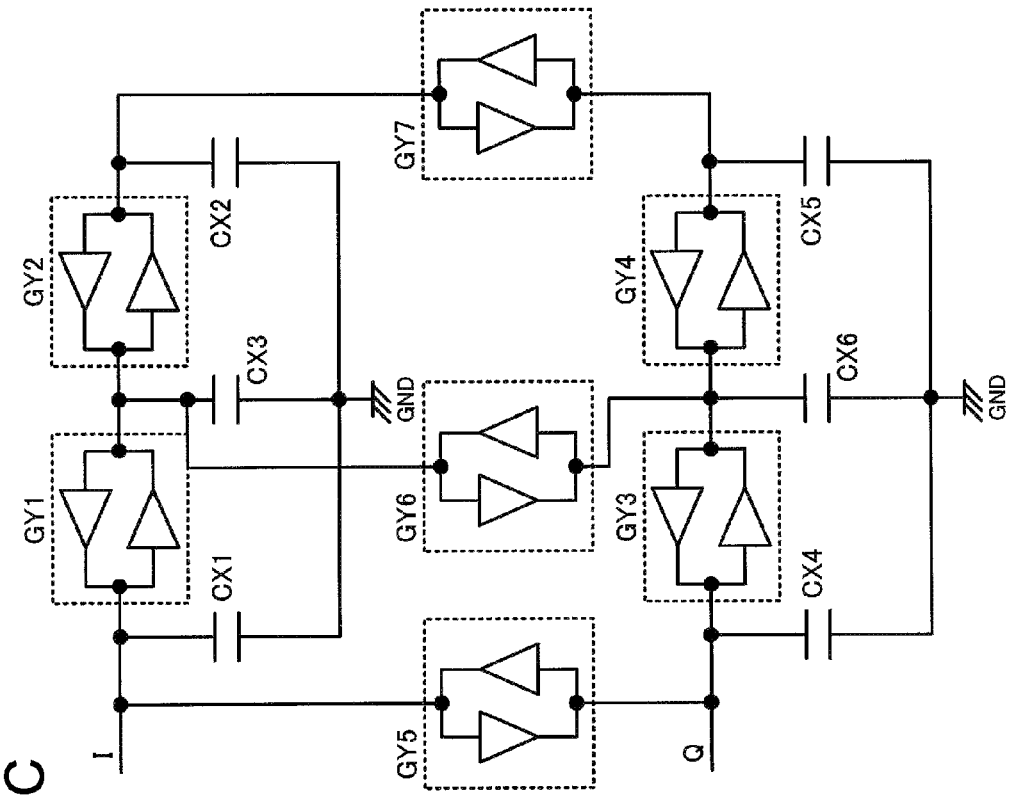
FIGS. 2A to 2C are diagrams, each illustrating a basic configuration of a complex BPF.
Figure 2B:
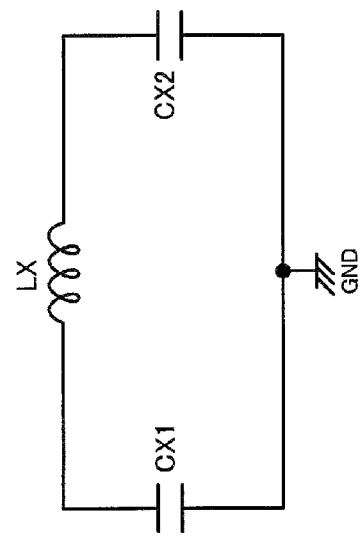
Figure 2C:
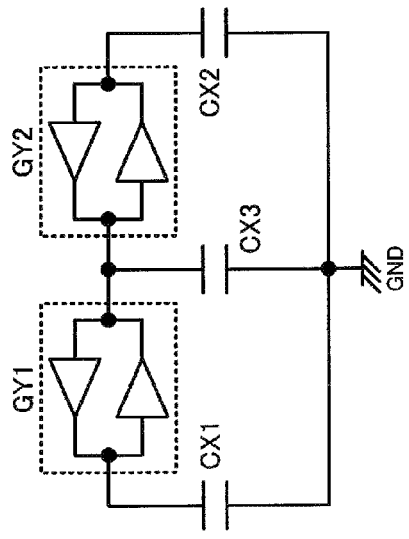

FIGS. 2A, 2B, 2C are diagrams, each illustrating a basic configuration of the complex BPF. FIG. 2A illustrates the low pass filter (LPF) that is a source of the BPF. The LPF is configured from an inductor LX, and capacitors CX1 and CX2.

FIG. 2B illustrates LPF in which the inductor LX is replaced with a capacitor CX3, and gyrators GY1, and GY2. Each of the gyrators GY1 and GY2 is configured from two OTAs. In an integrated circuit device, the inductor (a coil) is difficult to form within a chip, but the use of the gyrators makes the formation of LPF within the chip easy.

FIG. 2C illustrates a configuration of the complex BPF in which two LPFs in FIG. 2B is provided and further the center frequency shift circuits (the gyrators) GY5, GY6, and GY7 are added. GY5, GY6, and GY7 have the same configuration as the gyrator described above, but the gyrator that is used to shift the center frequency is referred to as the center frequency shift circuit in order to distinguish it from the gyrator with which to replace the inductor. A first signal I is input to one LPF, and a second signal Q, which is different by 90 degrees in phase from the first signal I, is input to the other LPF. Then, the center frequency of LPF is shifted by connecting the capacitors included in each LPF with the gyrators, and thus the band pass filter can be realized.

2. Transconductance Adjustment Circuit

Figure 3:
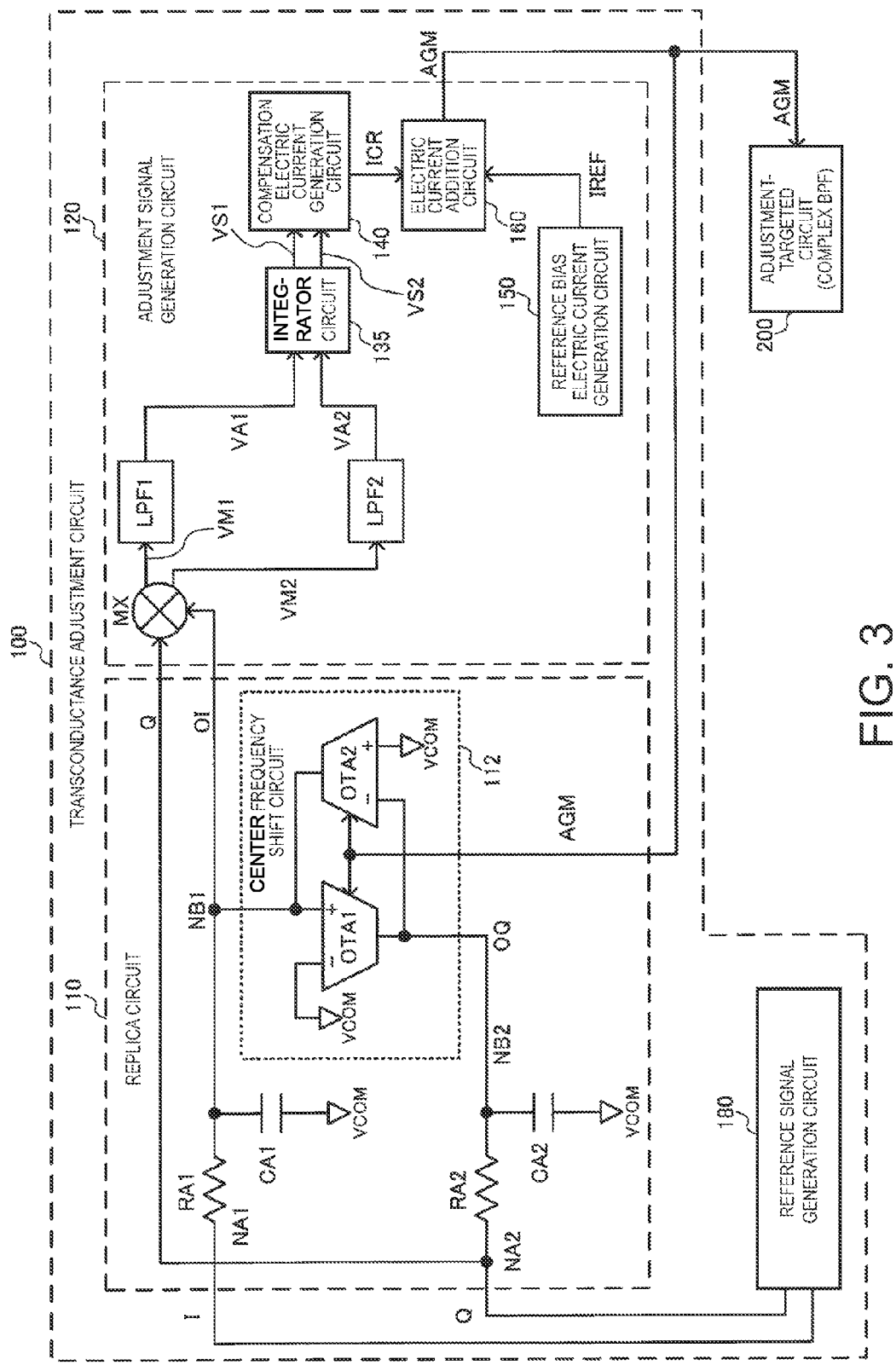
FIG. 3 is a diagram illustrating a first configuration example of a transconductance adjustment circuit.

FIG. 3 illustrates a first configuration example of a transconductance adjustment circuit 100 according to the embodiment. The transconductance adjustment circuit 100 in the first configuration example includes a replica circuit 110, an adjustment signal generation circuit 120, and a reference signal generation circuit 180. Moreover, the transconductance adjustment circuit according to the embodiment is not limited to the configuration in FIG. 3, and various modifications are possible, such as omission of one part of the constituent element thereof, replacement with another constituent element, and addition of another constituent element.

In the transconductance adjustment circuit 100 according to the embodiment, as described below, it is possible to compensate for a variation (a deviation) from a design value in a characteristic of a filter due to variations in the IC manufacturing process in a transconductance and a passive element, and the variations in power source, temperature and the like, by adjusting the transconductance that serves as a factor in determining a characteristic of the complex BPF circuit that is used, for example, in a wireless circuit.

The replica circuit 110 is the complex BPF, and is a replica circuit of an adjustment-targeted circuit (the complex BPF circuit) 200. The first signal I and the second signal Q, which are different by 90 degrees in phase from the first signal I, are input to the replica circuit 110. The replica circuit 110 generates a first output signal OI and a second output signal OQ. The replica circuit 110 in FIG. 3 is a first complex BPF, and includes a first resistor element RA1, a second resistor element RA2, a first capacitor CA1, a second capacitor CA2, and the center frequency shift circuit 112.

The first signal I is input to a first input node NA1, and the second signal Q, which is different by 90 degrees in phase from the first signal I, is input to a second input node NA2. Specifically, for example, in a case where the first signal I is expressed as cos (ωt) as a function of time t, the second signal Q is expressed as sin (ωt). At this point, ω is an angular frequency of the first and second signals I and Q.

The first output signal OI is output from a first output node NB1, and the second output signal OQ is output from a second output node NB2.

The first resistor element RA1 is provided between the first input node NA1 and the first output node NB1. Furthermore, the second resistor element RA2 is provided between the second input node NA2 and the second output node NB2. Each of the first and second resistor elements RA1 and RA2 may be configured from a passive resistor element that uses, for example, a polysilicon thin film and may be configured from an operational transconductance amplifier (OTA). Moreover, the passive resistor element is desirable, in terms of a linearity characteristic of the resistor element.

One end of the first capacitor CA1 is connected to the first output node NB1, and the other end is connected, for example, to a common electric potential node VCOM. Moreover, one end of the second capacitor CA2 is connected to the second output node NB2, and the other end is connected to the common electric potential node VCOM. Each of the first and second capacitors CA1 and CA2 may be configured, for example, from a metal insulator metal (MIM) structure.

The center frequency shifting circuit 112 is configured from the first and second operational transconductance amplifiers OTA1 and OTA2 that are provided between the first output node NB1 and the second output node NB2. The frequency characteristic may be shifted by the center frequency ω0 by connecting the low pass filters (RA1 and CA1) of a system of the first signal I, and the low pass filters (RA2 and CA2) of a system of the second signal Q via one pair of OTAs that are different in polarity from each other (one is positive in polarity and the other is negative in polarity). As a result, the band pass filter (the first complex BPF) may be obtained. At this point, when transconductance values of OTA1 and OTA2 are set to gm, and capacitance values of the capacitors CA1 and CA2 is set to C, a center frequency ω0 is given ω0=gm/C.

For example, in FIG. 3, OTA1 is positive in polarity, and outputs a first output electric current based on the first output signal OI that is input to a non-inversion input terminal(+), and the second capacitor CA2 is charged by the first output electric current, and thus the second output signal OQ is output. Then, OTA2 is negative in polarity, and outputs a second output electric current based on the second output signal OQ that is input to an inversion input terminal(−), and the first capacitor CA1 is charged by the second output electric current, and thus the first output signal OI is output.

The non-inversion input terminal(+) of OTA1 is connected to the first output node NB1, the inversion input terminal(−) thereof is connected to the common electric potential node VCOM, and an output terminal thereof is connected to the second output node NB2. The non-inversion input terminal (+) of OTA2 is connected to the common electric potential node VCOM, the inversion input terminal(−) thereof is connected to the second output node NB2, and an output terminal thereof is connected to the first output node NB1. A transconductance adjustment signal AGM from the adjustment signal generation circuit 120 is input to OTA1 and OTA2, and the transconductances of OTA1 and OTA2 are adjusted by the transconductance adjustment signal AGM.

The common electric potential node VCOM is a common electric potential (an analog reference electric potential, and an analog ground) node with respect to an analog signal, and for example, is an electric potential node halfway between a first power source electric potential (a low electric potential side power source electric potential) VSS and a second power source electric potential (a high electric potential side power source electric potential) VDD.

The adjustment signal generation circuit 120 outputs the transconductance adjustment signal AGM with respect to the center frequency shift circuit 112 and the adjustment-targeted circuit (for example, the complex BPF circuit) 200 that is targeted for transconductance adjustment. The AGM is a signal that adjusts the transconductances (gm) of OTA1 and OTA2 included in the center frequency shift circuit 112 and gm of OTA included in the adjustment-targeted circuit (the complex BPF circuit) 200.

The adjustment signal generation circuit 120 generates the transconductance adjustment signal AGM based on the second signal Q and the first output signal OI, or based on the first signal I and the second output signal OQ. Specifically, a phase difference between the second signal Q and the first output signal OI is detected, or a phase difference between the first signal I and the second output signal OQ is detected, and the transconductance adjustment signal AGM is generated based on the phase difference.

The reference signal generation circuit 180 outputs the first signal I and the second signal Q that is different by 90 degrees in phase from the first signal I. Specifically, the reference signal generation circuit 180 generates the first signal I and the second signal Q that change in voltage at between a first voltage level VH and a second voltage level VL, based on a clock signal, and outputs them with respect to the replica circuit. Specific values of the first voltage level VH and the second voltage level VL, for example, are VH=1.51V and VL=1.49V when VDD=3V and VSS=0V. Furthermore, signal wave forms of the first and second signals I and Q, for example, are square wave signals, but other signal waveforms may be allowed. Furthermore, as described below, the reference signal generation circuit 180 may output first to fourth signals IP, QP, IN and QN that are different by 90 degrees in phase from one another. The reference signal generation circuit 180 is described in detail below.

The adjustment signal generation circuit 120 includes a mixer MX, smoothing circuits LPF1 and LPF2, an integrator circuit 135, a compensation electric current generation circuit 140, a reference bias electric current generation circuit 150, and an electric current addition circuit 160.

The first signal I and the second output signal OQ are input to the mixer MX, or the second signal Q and the first output OI are input to the mixer MX. The mixer MX detects the phase difference between the first signal I and the second output signal OQ, or the phase difference between the second signal Q and the first output signal OI, and thus outputs first and second mixer output signals VM1 and VM2 that are differential signals.

The first smoothing circuit LPF1 smooths the first mixer output signal VM1 from the mixer MX, removes an alternating current component, and thus outputs a direct current component VA1. Furthermore, the second smoothing circuit LPF2 smooths the second mixer output signal VM2 from the mixer MX, removes an alternating current component, and thus outputs a direct current component VA2. A voltage difference VA1−VA2 between the direct current components VA1 and VA2 depends on the phase difference between two signals (for example, Q and OI) that are input to the mixer MX. Moreover, a relationship between the phase difference between the two signals (for example, Q and OI) and the characteristic of the adjustment-targeted circuit (the complex BPF circuit) 200 is described below.

The output signals VM1 and VM2 of the mixer MX are given by the following expressions.

$$VM1 = V0 + V(t)/2 \quad (1)$$

$$VM2 = V0 - V(t)/2 \quad (2)$$

In the expressions, V0 is an offset voltage, and when the mixer has an ideal characteristic, V0 is 0. However, in the actual circuit, V0 is not 0, because the characteristic of the transistor and the like deviates from the design value due to the variations in the IC manufacturing process. The offset voltage V0 changes depending on the variations in the IC manufacturing process and the variation in power source voltage, temperature, and the like. However, the offset voltage V0 may be eliminated by acquiring a differential signal difference VM1−VM2. When this is done, because influences of the variations in the IC manufacturing process and the variations in power source voltage, temperature and the like, included in V0, can be taken out, the phase difference ϕ between the two signals (for example, Q and OI) may be detected with high precision. Moreover, V0 in the expression is omitted in the following description.

For example, when the second signal Q to be input to MX is set to sin(ωt) and the first output signal OI is set to cos(ωt+ϕ), V(t) in Expressions (1) and (2) is given by the following expression.

$$V(t) = k(\sin(2\omega t + \phi) - \sin \phi) \quad (3)$$

In the expression, k is a constant that is determined depending on the characteristic of the mixer, and ϕ is a phase difference that the first output signal OI has with respect to the first signal I.

The direct current components of the mixer output signals VM1 and VM2 are taken out by the smoothing circuits LPF1 and LPF2. The output signals VA1 and VA2 of the smoothing circuits LPF1 and LPF2 are given by the following expressions, which comes from (1), (2) and (3).

$$VA1 = -k \cdot \sin \phi/2 \quad (4)$$

$$VA2 = +k \cdot \sin \phi/2 \quad (5)$$

Figure 4:
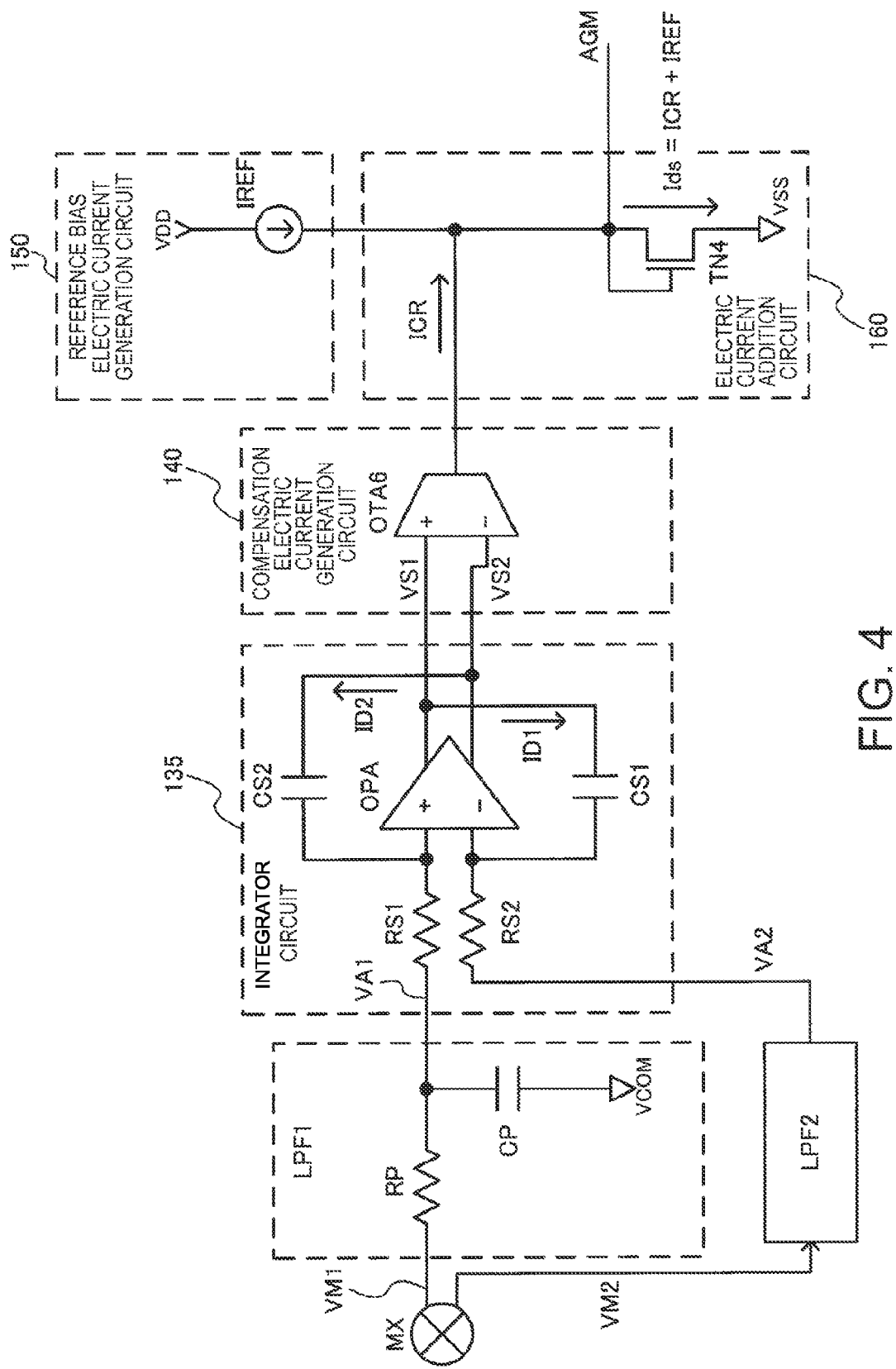
FIG. 4 is a diagram illustrating a detailed configuration example of a smoothing circuit, an integrator circuit, a compensation electric current generation circuit, and an electric current addition circuit, in the first configuration example.

FIG. 4 illustrates a detailed configuration example of the smoothing circuits LPF1 and LPF2, the integrator circuit 135, compensation electric current generation circuit 140, and the electric current addition circuit 160 in the first configuration example. The smoothing circuit LPF1 includes the resistor element RP and the capacitor CP, and smooths the mixer output signal VM1, and thus outputs the direct current component as the output signal VA1. Furthermore, the smoothing circuit LPF2, like LPF1, includes the resistor element and the capacitor, and smooths the mixer output signal VM2, and thus outputs the direct current component as the output signal VA2.

The integrator circuit 135 includes an operational amplifier OPA, resistor elements RS1 and RS2, and capacitors CS1 and CS2, and integrates output signals VA1 and VA2 of the smoothing circuits LPF1 and LPF2, and thus outputs first and second integrated voltages VS1 and VS2. When the electric current flowing through the capacitors CS1 and CS2 from the operational amplifier OPA is set to ID1 and ID2, respectively, and the capacity of the capacitor CS1 and CS2 is set to Cs, the integrated voltages VS1 and VS2 are given by the following expressions.

$$VS1(t) = \frac{1}{Cs} \int_0^t ID1(t)\,dt \quad (6)$$

$$VS2(t) = \frac{1}{Cs} \int_0^t ID2(t)\,dt \quad (7)$$

At this point, because when ϕ<0, then VA1>0 and VA2<0 from Expressions (4) and (5), it follows that ID1>0 and ID2<0. ID1 charges the capacitor CS1, and ID2 discharges the capacitor CS2. On the other hand, because when ϕ>0, then VA1<0 and VA2>0, it follows that ID1<0 and ID2>0. ID1 discharges the capacitor CS1, and ID2 charges the capacitor CS2. Furthermore, because when ϕ=0, then VA1=0 and VA2=0, it follows that ID1=0, and ID2=0. Electric charges of the capacitor CS1 and CS2 do not change.

As understood from Expressions (6) and (7), during a period of time when ID1 (ID2) is positive, VS1 (VS2) increases with time, and during a period of time when ID1 (ID2) is negative, VS1 (VS2) decreases with time. Then, during a period of time when ID1 (ID2) is 0, VS1 (VS2) is held as a constant value.

The compensation electric current generation circuit 140 includes OTA6 as a voltage control electric current source. The integrated voltage VS1 is input to the non-inversion input terminal(+), and the integrated voltage VS2 is input to the inversion input terminal(−). Then, a compensation electric current ICR is generated that is in proportion to an integrated voltage difference VS1−VS2. The compensation electric current ICR is an electric current that compensates for a deviation of the transconductance (gm) of OTA included in the complex BPF circuit (the adjustment-targeted circuit in a broad sense) 200, from the design value. When the transconductance value of OTA6 is set to gm6, the compensation electric current ICR is given by the following Expression.

$$ICR = gm6 \cdot (VS1 - VS2) \quad (8)$$

The reference bias electric current generation circuit 150 generates a reference bias electric current IREF. The reference bias electric current IREF is an electric current that serves as a reference for generating a tail electric current that gives the design value of the transconductance (gm) of OTA included in the complex BPF circuit (the adjustment-targeted circuit in a broad sense) 200. That is, the reference bias electric current IREF is an electric current that serves as the reference for generating the tail electric current that gives the design value of gm of OTA, in a case where the element characteristic, the power source voltage, and the temperature are according to the design value. Moreover, a relationship between gm of OTA and the tail electric current is described below.

The electric current addition circuit 160 adds the compensation electric current ICR and the reference bias electric current IREF. The electric current that results from adding the compensation electric current ICR and the reference bias electric current IREF is an electric current that serves as the reference for generating the tail electric current that gives the desired (post-compensation) gm value of OTA.

Specifically, the electric current addition circuit 160 includes, for example, an N type transistor TN4, as illustrated in FIG. 4. Because a drain electric current Ids of TN4 is Ids=ICR+IREF, a voltage between a gate and a source of TN4 is output as the transconductance adjustment signal AGM. Moreover, the configuration example of OTA and the adjustment of gm by the transconductance adjustment signal AGM are described below.

Figure 5:
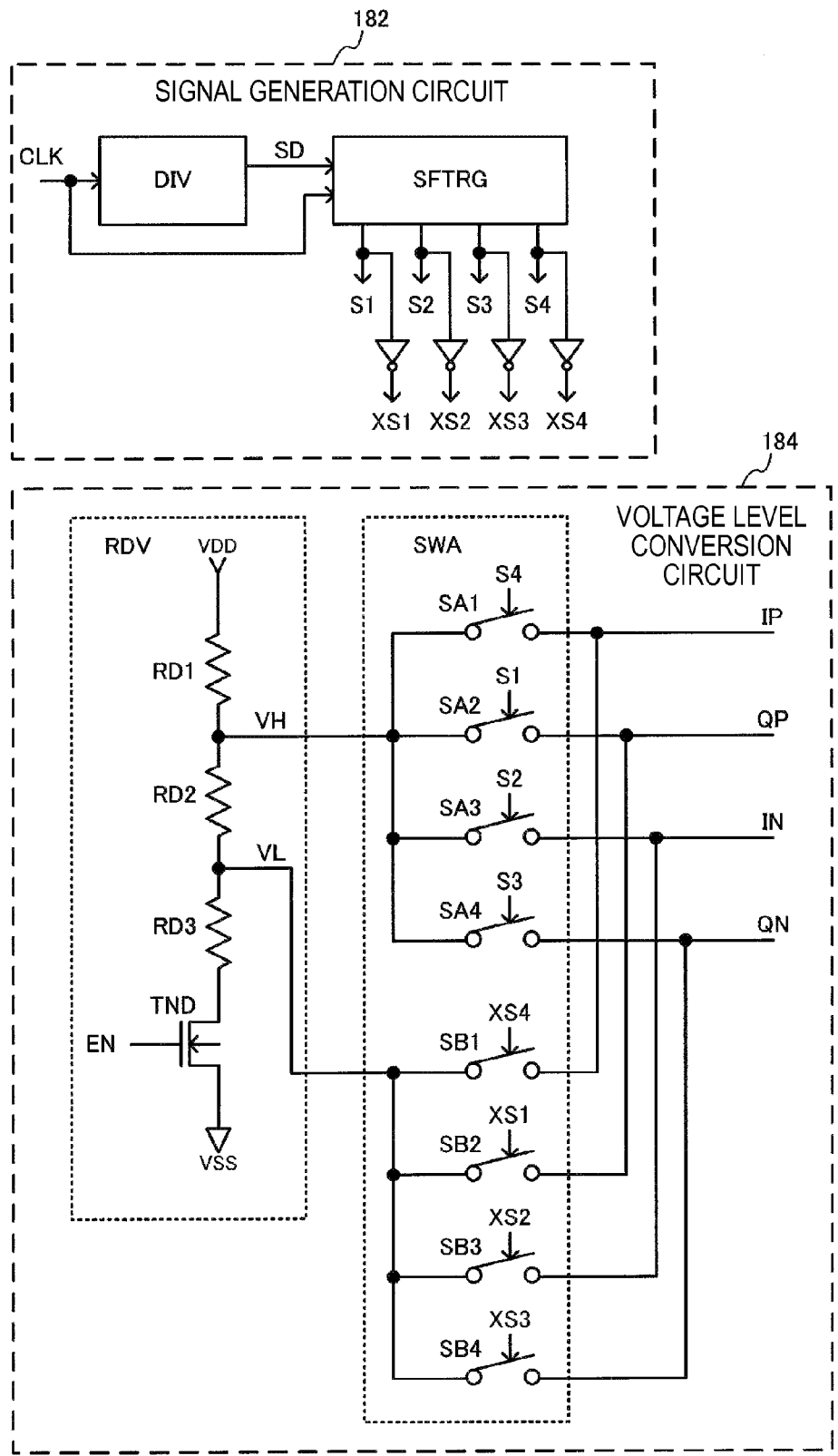
FIG. 5 is a diagram illustrating a first configuration example of a reference signal generation circuit.

A first configuration example of the reference signal generation circuit 180 is illustrated in FIG. 5. The reference signal generation circuit 180 in the first configuration example includes a signal generation circuit 182 and a voltage level conversion circuit 184. Moreover, the reference signal generation circuit according to the embodiment is not limited to the configuration in FIG. 5, and various modifications are possible, such as omission of one part of the constituent element thereof, replacement with another constituent element, and addition of another constituent element.

The signal generation circuit 182 includes a divider DIV and a shift resister SFTRG, and generates a first square wave signal S1 to an n-th (n is an integer equal to or greater than 2) square wave signal Sn that are different in phase from one another, based on a clock signal CLK. The divider DIV outputs a signal SD that results from dividing the clock signal CLK by 4. The shift resister SFTRG shifts the signal SD divided by the divider DIV using the clock signal CLK, and thus outputs the first square wave signal S1 to the n-th square wave signal Sn.

Specifically, in the signal generation circuit 182, for example, as illustrated in FIG. 5, the shift resister SFTRG outputs the square wave signals S1 to S4, and further outputs inversion signals XS1 to XS4 of the square wave signals S1 to S4 via the inverter.

The voltage level conversion circuit 184 includes a resistors chained circuit RDV and a switch circuit SWA. The first square wave signal S1 to the n-th square wave signal Sn are input. The voltage level conversion circuit 184 performs conversion processing on a voltage level, and thus outputs the first signal I and the second signal Q.

The resistors chained circuit RDV, includes, for example, resistor elements RD1, RD2, and RD3, and generates a first voltage level VH and a second voltage level VL by performing resistor division.

The switch circuit SWA includes, for example, switch elements SA1 to SA4 and SB1 to SB4. SA1 to SA4 and SB1 to SB4 are turned on and are turned off, based on the square wave signals S1 to S4 and the inversion signals XS1 to XS4, and alternately select the first voltage level VH and the second voltage level VL. Then, the first to fourth signals IP, QP, IN and QN, which change in voltage at between VH and VL are generated and are output by alternately selecting VH and VL.

For example, during a period of time when the square wave signal S4 is at an H level (a high electric potential level and a VDD level), the switch element SA1 is set to an ON state and the switch element SB1 is set to an OFF state. On the other hand, during a period of time when the square wave signal S4 is at an L level (a low electric potential level, a VSS level), the switch element SA1 is set at the OFF state and the switch element SB1 is set to the ON state. When this is done, during the period of time when the square wave signal S4 is at the H level, the first voltage level VH is output as the first signal IP, and during the period of time when the square wave signal S4 is at the L level, the second voltage level VL is output as the first signal IP.

An amplitude of the first to fourth signals IP, QP, IN, and QN, that is, VH–VL is equal to or less than half of the amplitude (VDD–VSS) of the clock signal CLK, and preferably is equal to or less than one quarter. For example, in a case where the amplitude of the clock signal CLK is 3V, the amplitude of the first to fourth signals IP, QP, IN, and QN is 20 mV. In this manner, by sufficiently decreasing the amplitude of the first to fourth signals IP, QP, IN, and QN, the linearity of OTA may be ensured, a SN ratio of the adjustment-targeted circuit (the complex BPF circuit) 200 may be ensured, and an influence of the double harmonics on the adjustment-targeted circuit (the complex BPF circuit) 200 may be decreased.

In a case where an enable-signal EN is at the H level, an N type transistor TND included in the resistors chained circuit RDV is set to the ON state and the resistors chained circuit RDV generates VH and VL. When this is done, during a period of time when the transconductance adjustment circuit 100 does not operate, power consumption may be decreased by setting the enable-signal EN to the L level.

Figure 6:
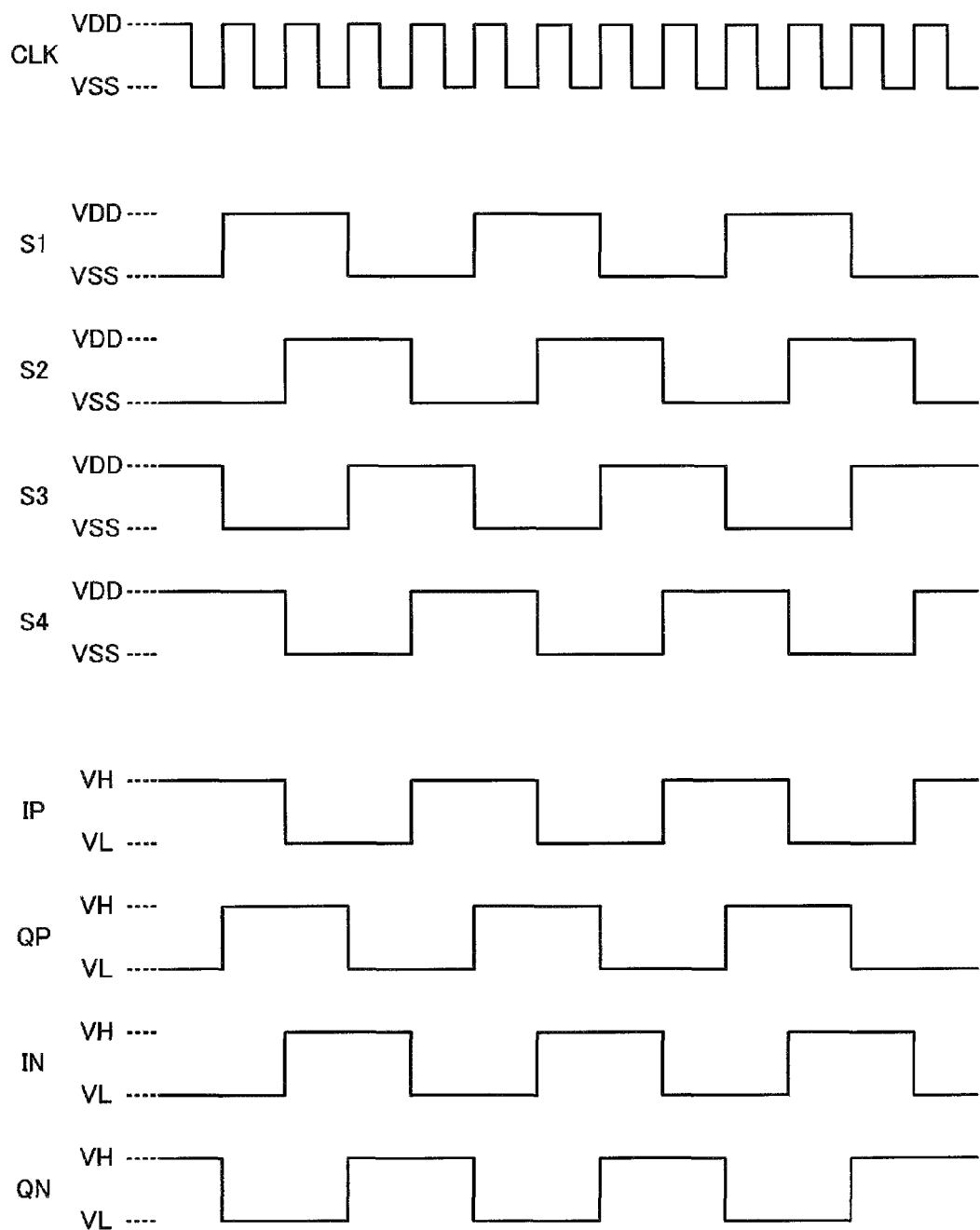
FIG. 6 is a diagram illustrating a signal waveform in the reference signal generation circuit.

FIG. 6 illustrates one example of a signal wave form in the reference signal generation circuit 180. FIG. 6 illustrates each signal waveform of the clock signal CLK, the square wave signals S1 to S4, and the first to fourth signals IP, QP, IN, and QN.

As illustrated in FIG. 6, according to the reference signal generation circuit 180, the first to fourth signals IP, QP, and IN and QN, which change in voltage at between the first voltage level VH and the second voltage level VL, are generated and are output. IP and QP are different by 90 degrees in phase, and IN and QN are different by 90 degrees in phase. Furthermore, IP and IN are different by 180 degrees in phase, and QP and QN are different by 180 degrees in phase.

For example, the first to fourth signals IP, QP, and IN and QN, output from the reference signal generation circuit 180, are the square waves, as illustrated in FIG. 6. However, because the replica circuit 110 to which the signals are input has a characteristic of the band pass filter (BPF), the first to fourth signals IP, QP, IN, and QN are shaped into sinusoidal waves and are output to the mixer MX.

Furthermore, the first to fourth signals IP, QP, IN, and QN, output from the reference signal generation circuit 180, includes a fundamental wave and an odd harmonic, and there is therefore a likelihood that a small amount of the odd harmonic remains in the output signal of the replica circuit 110. In this case, as a result of mixing the lowest-order harmonic (third) component with the mixer MX, quadruple and double harmonic components are output from the mixer MX. However, the frequency components are attenuated to a permitted level or below by the smoothing circuits LPF1 and LPF2 provided at the rear end of the mixer MX.

In the reference signal generation circuit 180 according to the embodiment uses the divider DIV and the shift resister SFTRG that are digital circuits, and performs timing control, based on the clock signal CLK. Therefore, phase difference control may be performed with a simple configuration and with high precision, compared to a case where the first to fourth signals IP, QP, IN, and QN are generated only by the analog circuit.

Figure 7:
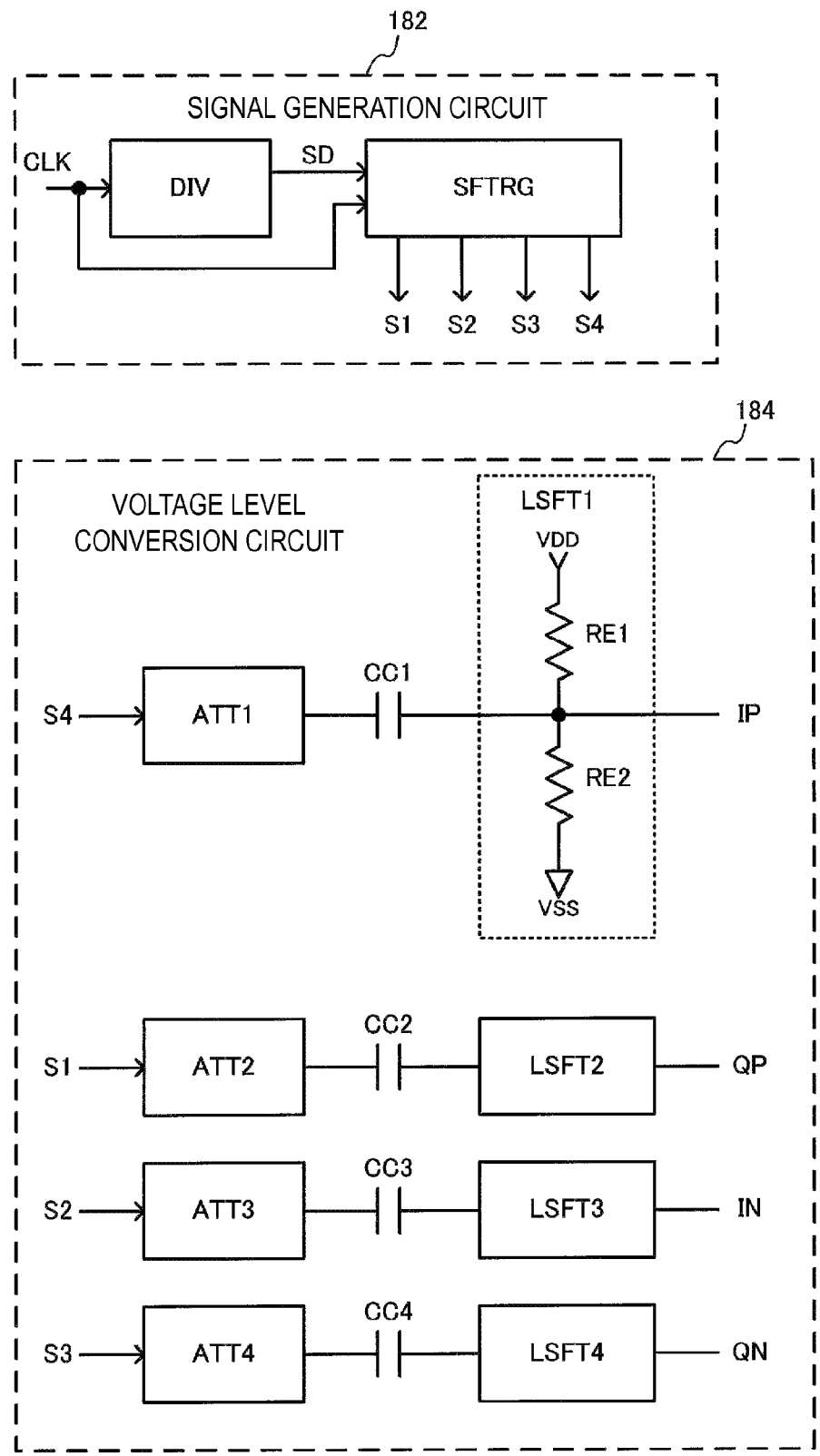
FIG. 7 is a diagram illustrating a second configuration example of the reference signal generation circuit.

FIG. 7 illustrates a second configuration example of the reference signal generation circuit 180. The reference signal generation circuit 180 in the second configuration example includes the signal generation circuit 182 and the voltage level conversion circuit 184. Moreover, the reference signal generation circuit according to the embodiment is not limited to the configuration in FIG. 7, and various modifications are possible, such as omission of one part of the constituent element thereof, replacement with another constituent element, and addition of another constituent element.

The signal generation circuit 182 includes the divider DIV and the shift resister SFTRG, and generates the first square wave signal S1 to the n-th (n is an integer equal to or greater than 2) square wave signal Sn that are different in phase from one another, based on the clock signal CLK. The divider DIV outputs the signal SD that results from dividing the clock signal CLK by 4. The shift resister SFTRG shifts the signal SD divided by the divider DIV using the clock signal CLK, and thus outputs the first square wave signal S1 to the n-th square wave signal Sn. For example, as illustrated in FIG. 5, the shift resister SFTRG outputs the square wave signals S1 to S4.

The voltage level conversion circuit 184 illustrated in FIG. 7 includes attenuators ATT1 to ATT4, capacitors CC1 to CC4, and level shift circuits LSFT1 to LSFT4. The attenuators ATT1 to ATT4 attenuate the first square wave signal S1 to a fourth square wave signal S4 (the n-th square wave signal Sn in a broad sense). The level shift circuits LSFT1 to LSFT4 shift the voltage level of the signal attenuated by the attenuators ATT1 to ATT4, and thus generate and output the first to fourth signals IP, QP, IN, and QN that change in voltage at between the first voltage level VH and the second voltage level VL. The capacitors CC1 to CC4 are provided to remove the direct current component.

The level shift circuit LSFT1 includes the resistor elements RE1 and RE2, and for example, generates the voltage halfway between the first electric source voltage VSS and the second electric source voltage VDD by performing the resistor division. Then, the attenuated signal from the attenuator ATT1 may be superimposed, and thus the first signal IP, which change in voltage at between the first voltage level VH and the second voltage level VL, can be generated and be output. Similarly, the level shift circuits LSFT2 to LSFT4 may generate and output the second to fourth signals QP, IN and QN that change in voltage at between the first voltage level VH and the second voltage level VL.

An attenuation rate used by the attenuators ATT1 to ATT4 is set in such a manner that the amplitude of the first to fourth signals IP, QP, IN, and QN, that is, VH-VL is half of the amplitude of the clock signal CLK (VDD-VSS) or less, and preferably to a quarter or less.

Figure 8:
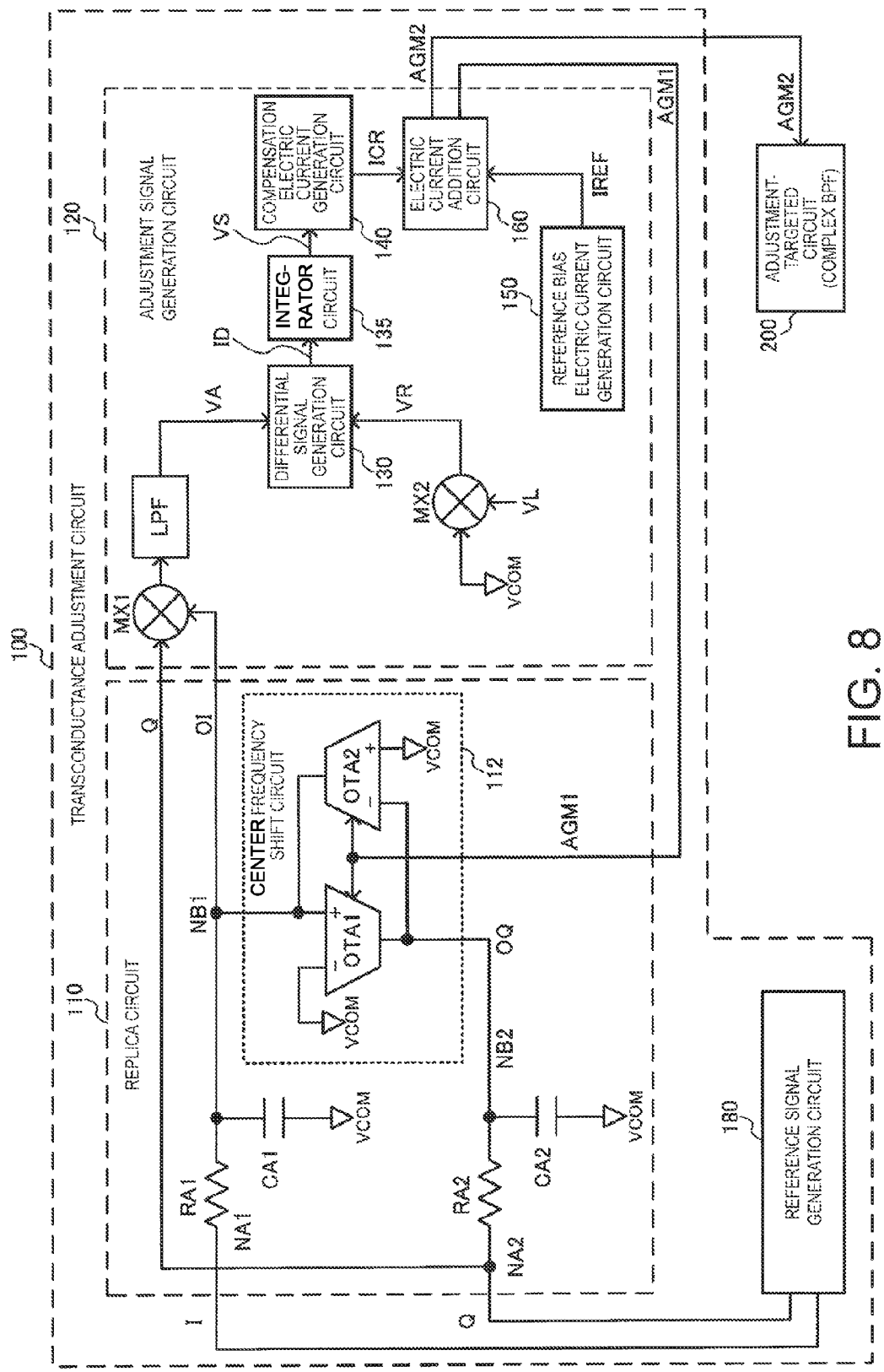
FIG. 8 is a diagram illustrating a second configuration example of the transconductance adjustment circuit.

FIG. 8 illustrates the second configuration example of the transconductance adjustment circuit 100 according to the embodiment. As in the first configuration example described above, a replica circuit 110, an adjustment signal generation circuit 120, and a reference signal generation circuit 180 are included in the second configuration example. Moreover, the transconductance adjustment circuit according to the embodiment is not limited to the configuration in FIG. 8, and various modifications are possible, such as omission of one part of the constituent element thereof, replacement with another constituent element, and addition of another constituent element.

The replica circuit 110 and the reference signal generation circuit 180 are the same as in the first configuration example described above, and thus detailed descriptions thereof are omitted.

The adjustment signal generation circuit 120 includes mixers MX1 and MX2, a smoothing circuit LPF, a differential signal generation signal 130, an integrator circuit 135, a compensation electric current generation circuit 140, a reference bias electric current generation circuit 150, and an electric current addition circuit 160.

A first signal I and a second output signal OQ are input to the mixer MX1, or the second signal Q and the first output signal OI are input to the mixer MX1. The mixer MX1 detects a phase difference between the first signal I and the second output signal OQ, or the phase difference between the second signal Q and the first output signal OI.

The smoothing circuit LPF smooths an output signal from the mixer MX1, removes an alternating current component, and thus outputs a direct current component. A voltage of the direct current component depends on the phase difference between two signals (for example, Q and OI) that are input to the mixer MX1. The adjustment signal generation circuit 120 generates a transconductance adjustment signal AGM, based on the output of the smoothing circuit LPF. Moreover, a relationship between the phase difference between the two signals (for example, Q and OI) and a characteristic of an adjustment-targeted circuit (a complex BPF circuit) 200 is described below.

A differential signal generation circuit 130 generates a differential signal electric current ID (a differential signal in a broad sense) based on the difference between an output signal VA of the smoothing circuit LPF, and a reference voltage signal VR. The adjustment signal generation circuit 120 generates the transconductance adjustment signal AGM based on the differential signal electric current ID.

One input terminal of the second mixer MX2 is set to a first electric current voltage level, and the other terminal is set to a second electric current voltage level, and thus the reference voltage signal VR is output. Specifically, as illustrated in FIG. 8, the one input terminal is set to a first logic level (an L level and a low electric potential level) VL, and, the other input terminal is set to a common electric potential VCOM. The common electric potential VCOM is a common electric potential (an analog reference potential and an analog ground) with respect to an analog signal, and for example, is an electric potential halfway between a first power source electric potential (a low electric potential side power source electric potential) VSS and a second power source electric potential (a high electric potential side power source electric potential) VDD.

When the output signal of the mixer MX1 is set to V1 and the output signal of the mixer MX2 is set to V2, V1 and V2 are given by the following expressions.

$$V1 = V0 + V(t) \quad (9)$$

$$V2 = V0 \quad (10)$$

In the expressions, V0 denotes an offset voltage, and when the mixer has an ideal characteristic, then V0 is 0. However, in the actual circuit, V0 is not 0, because the characteristic of the transistor and the like deviates from the design value due to the variations in the IC manufacturing process. The output offset voltage V0 changes depending on the variations in the IC manufacturing process and the variations in power source voltage, the temperature, and the like. The reference voltage signal VR, output by MX2, is a mixer output signal when both of the input signals of the mixer are set to 0, and includes the offset voltage V0, output from the mixer.

When transistors, resistor elements, and the like that make up the two mixers MX1 and MX2, are the same in structure and in size, and are arranged adjacent to one another on a chip, a fluctuation in the offset voltage V0 due to the variations in the IC manufacturing process and the variations in power source voltage, temperature, and the like is the same for MX1 and MX2.

For example, when the second signal Q to be input to MX1 is set to sin (ωt), and the first output signal OI is set to cos (ωt+φ), then V(t) in Expression (9) is given by the following expression.

$$V(t) = k \cdot (\sin(2\omega t + \phi) - \sin \phi) \quad (11)$$

In the expression, k is a constant that is determined depending on the characteristic of the mixer, and φ is a phase difference that the first output signal OI has with respect to the first signal I.

When the direct current component of the output signal V1 of MX1 is taken out by the smoothing circuit LPF, the output signal VA of the smoothing circuit LPF is given by the following expression, which comes from Expressions (9) and (11).

$$VA = V0 - k \cdot \sin \phi \quad (12)$$

The phase difference φ between the two signals (for example, Q and OI) may be detected with high precision, because influences of the variations in the IC manufacturing process and the variations in power source voltage, temperature, and the like, which are included in V0, can be taken out by the differential signal generation circuit 130 taking a difference VA−VR between VA and VR (=V0).

Figure 9:
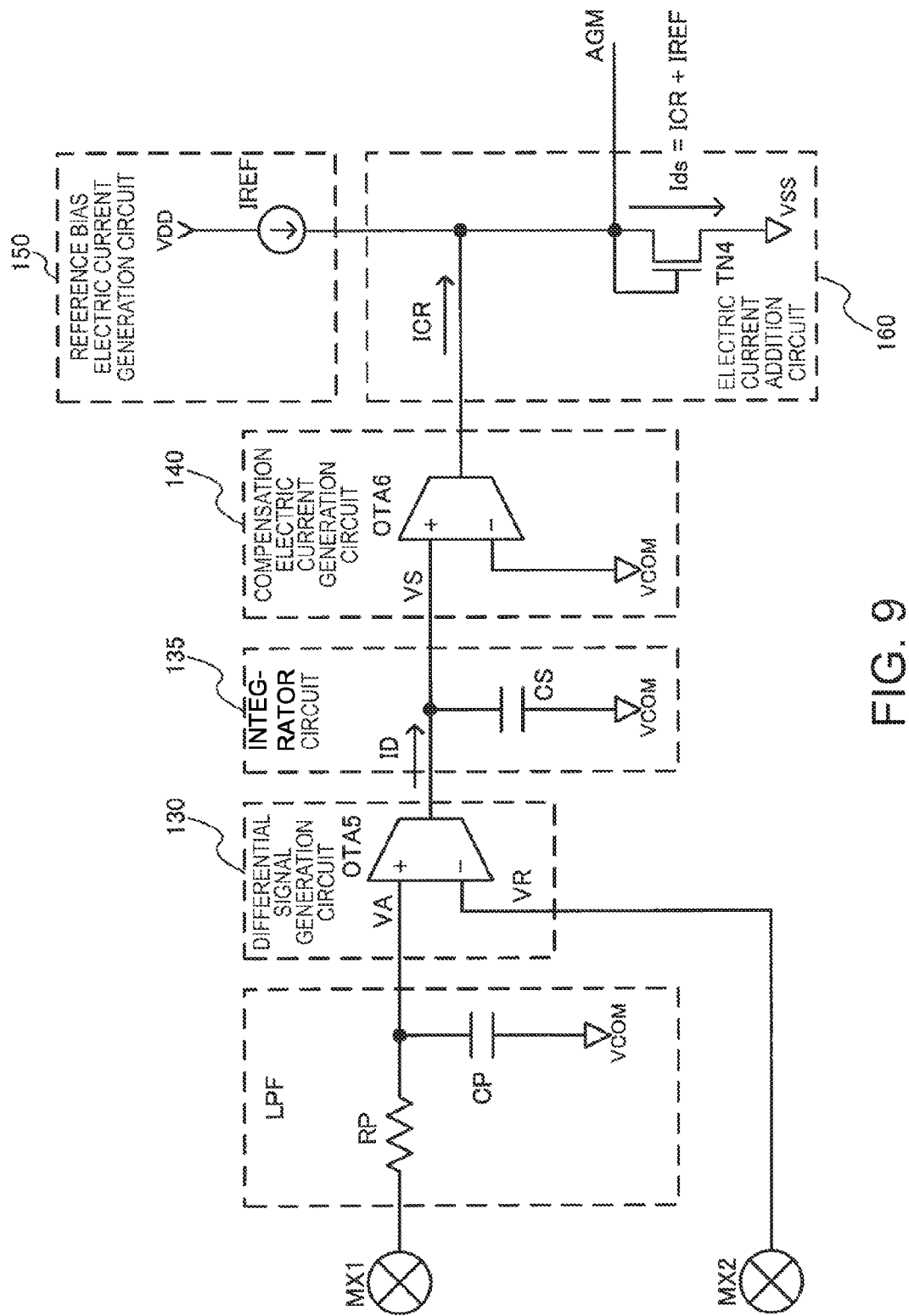
FIG. 9 is a diagram illustrating a detailed configuration example of a smoothing circuit, a differential signal generation circuit, an integrator circuit, a compensation electric current generation circuit, and an electric current addition circuit, in the second configuration example.

FIG. 9 illustrates a detailed configuration example of a smoothing circuit LPF, a differential signal generation circuit 130, an integrator circuit 135, a compensation electric current generation circuit 140, and an electric current addition circuit 160, in the second configuration example. The smoothing circuit LPF includes the resistor element RP and the capacitor CP, and smooths the output signal from the mixer MX1, and thus outputs the direct current component as the output signal VA.

The compensation electric current generation circuit 130 includes OTA5 as a voltage control electric current source. The output signal VA of the smoothing circuit LPF is input to a non-inversion input terminal(+), and the reference voltage signal VR is input to the inversion input terminal(−). Then, an electric current that is in proportion to the difference VA−VR is output as the differential signal electric current ID. For example, when VA is given by Expression (4), ID is given by the following Expression.

$$ID = -gm5 \cdot k \cdot \sin \phi \quad (13)$$

In the expression, gm5 denotes a value of the transconductance value of OTA5.

When ID>0, then ID flows from OTA5 toward the integrator circuit 135, and when ID<0, then ID flows from the integrator circuit 135 to OTA5. That is, when φ<0 from Expression (13), then ID>0, and ID charges the capacitor CS of the integrator circuit 135. On the other hand, when φ>0, then ID<0, and ID discharges the capacitor CS of the integrator circuit 135.

The integrator circuit 135 includes the capacitor CS, and integrates the differential signal electric current ID, and thus outputs the integrated voltage VS. The integrated voltage VS is given by the following expression.

$$VS(t) = \frac{1}{Cs} \int_0^t ID(t)\,dt \quad (14)$$

In the expression, Cs denotes capacity of the capacitor CS. As understood from Expression (14), during a period of time when ID is positive, the VS increases with time, and during a period of time when ID is negative, the VS decreases with time. Then, during a period of time when ID is 0, the VS is held as a constant value.

The compensation electric current generation circuit 140 includes OTA6 as a voltage control electric current source. The integrated voltage VS is input to the non-inversion input terminal(+), and the inversion input terminal(−) is set to a common electric potential VCOM. Then, a compensation electric current ICR is generated that is in proportion to the integrated voltage VS from the integrator circuit 135. The compensation electric current ICR is an electric current that compensates for a deviation of the transconductance (gm) of OTA included in the complex BPF circuit (the adjustment-targeted circuit in a broad sense) 200, from the design value. When the transconductance value of OTA6 is set to gm6, the compensation electric current ICR is given by the following expression.

$$ICR = gm6 \cdot VS \quad (15)$$

The reference bias electric current generation circuit 150 generates a reference bias electric current IREF. The reference bias electric current IREF is an electric current that serves as a reference for generating a tail electric current that gives the design value of the transconductance (gm) of OTA included in the complex BPF circuit (the adjustment-targeted circuit in a broad sense) 200. That is, the reference bias electric current IREF is an electric current that serves as the reference for generating the tail electric current that gives the design value of gm of OTA, in a case where the element characteristic, the power source voltage, and the temperature are according to the design value. Moreover, a relationship between gm of OTA and the tail electric current is described below.

The electric current addition circuit 160 adds the compensation electric current ICR and the reference bias electric current IREF. The electric current that results from adding the compensation electric current ICR and the reference bias electric current IREF is an electric current that serves as the reference for generating the tail electric current that gives the desired (post-compensation) gm value of OTA.

Specifically, the electric current addition circuit 160 includes, for example, an N type transistor TN4, as illustrated in FIG. 9. Because a drain electric current Ids of TN4 is Ids=ICR+IREF, the voltage between a gate and a source of TN4 is output as the transconductance adjustment signal AGM. Moreover, the configuration example of OTA and the adjustment of gm by the transconductance adjustment signal AGM are described below.

Figure 10:
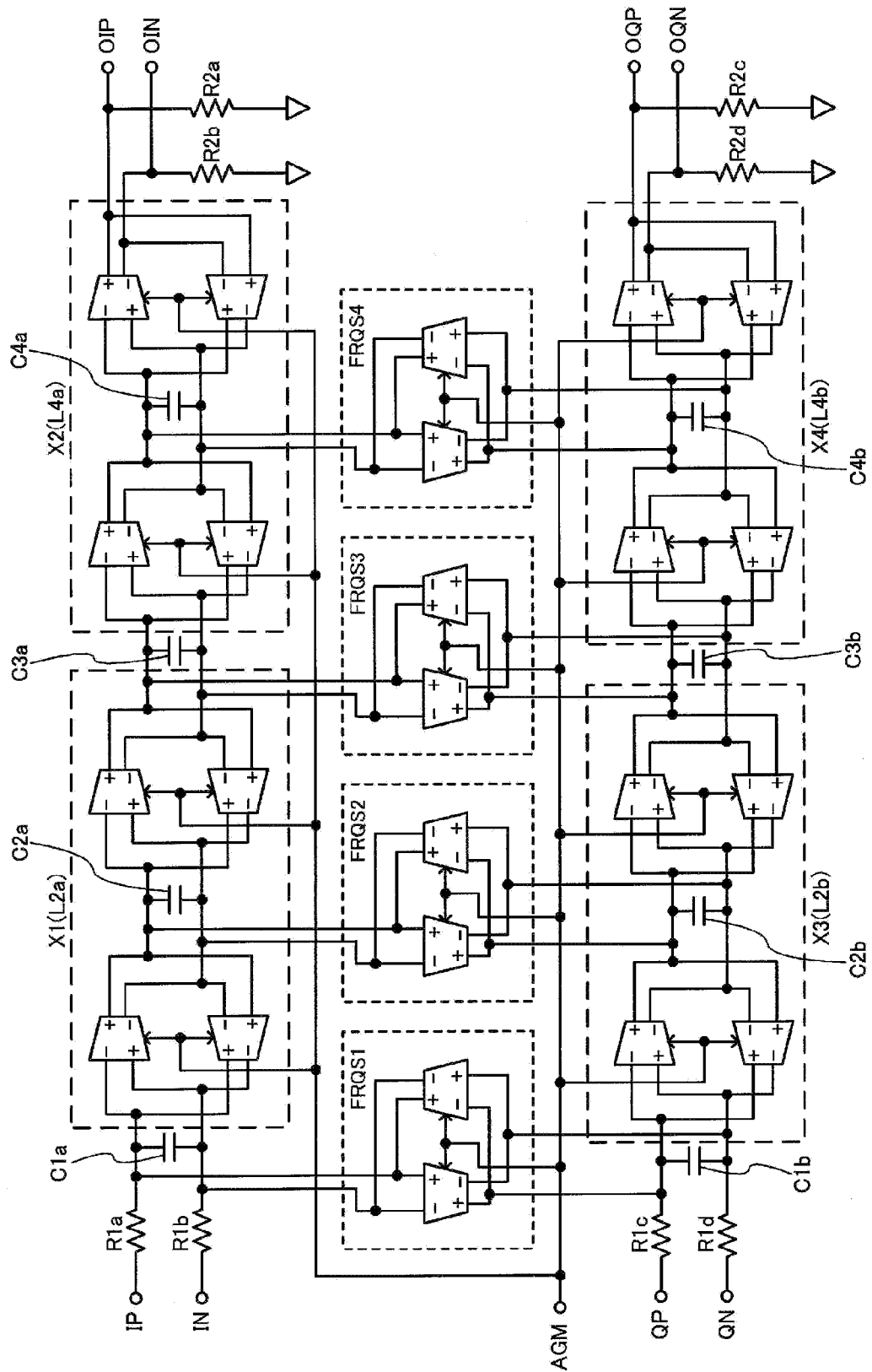
FIG. 10 is a diagram illustrating a configuration example of the complex BPF circuit.

FIG. 10 illustrates the configuration example of the complex BPF circuit (an adjustment-targeted circuit in a broad sense) 200. The complex BPF circuit 200, illustrated in FIG. 3, includes resistor elements R1a to R1d, and R2a to R2d, capacitors C1a, C1b, C3a, and C3b, center frequency shifting circuits FRQS1 to FRQS4, and inductor equivalent circuits X1 to X4. Moreover, the complex BPF circuit according to the embodiment is not limited to the configuration in FIG. 10, and various modifications are possible, such as omission of one part of the constituent element thereof, replacement with another constituent element, and addition of another constituent element. For example, the order of the complex BPF circuit 200 may not be limited to the 4th order, and other orders can be allowed.

The center frequency shifting circuits FRQS1 to FRQS4 is configured from two operational transconductance amplifiers (OTA). As described above, the frequency characteristic can be shifted by the center frequency ω0 by connecting the low pass filter of a system of the first signal I, and the low pass filter of a system of the second signal Q via one pair of OTAs that are different in polarity from each other. That is, a band pass filter (the fourth complex BPF) can be obtained from a low pass filter.

Inductor equivalent circuits X1 to X4 are configured from four operational transconductance amplifiers (OTA) and one capacitor, and operate as inductors L2a, L4a, L2b, and L4b. When a capacitance value of capacitors C2a, C4a, C2b, and C4b included in the inductor equivalent circuits X1 to X4 is set to Cx, and a transconductance value of each OTA is set to gm, an inductance value L of each of the inductor L2a, L4a, L2b, and L4b is given by $L=Cx/gm^2$.

Four input signals IP, IN, QP, and QN are signals that are different in phase from one another. Furthermore, the IP and the IN are different by 180 degrees in phase, and QP and QN are different by 180 degrees in phase. That is, IP and IN make up one pair of differential signals, and QP and QN make up another pair. Furthermore, IP and QP are different by 90 degrees in phase, and IN and QN are different by 90 degrees in phase.

With respect to OTA included in the center frequency shifting circuits FRQS1 to FRQS4 and the inductor equivalent circuits X1 to X4, a transconductance value (a gm value) is adjusted based on a transconductance adjustment signal AGM from the transconductance adjustment circuit 100 described above.

When the complex BPF circuit 200 operates as a band pass filter and sets the center frequency thereof to f0, ω0 (=2×π× f0) and gm value of each OTA are set as follows.

$$gm1 = \omega0 \times CC1a \quad (16)$$

$$gm2 = \omega0 \times CC2a \quad (17)$$

$$gm3 = \omega0 \times CC3a \quad (18)$$

$$gm4 = \omega0 \times CC4a \quad (19)$$

In the expressions, gm1 to gm4 denote transconductance values of OTA, included in the center frequency shifting circuits FRQS1 to FRQS4, and CC1a, CC2a, CC3a, and CC4a denote capacitance values of capacitors C1a, C2a, C3a, and C4a. At the time of designing a circuit, the transconductance values gm1 to gm4 of each OTA and the capacitance values CC1a, CC2a, CC3a, and CC4a of the capacitors, are set up in such a manner that ω0 is a desired frequency.

In the actual circuit, gm or C changes due to the variations in the IC manufacturing process and the variations in power source voltage, temperature, and the like, and for that reason, the center frequency ω0 and a cutoff frequency of the BPF deviate from the design value. The transconductance adjustment circuit 100 according to the embodiment is a circuit which detects the deviation of the center frequency of the first complex BPF and adjusts the transconductance value gm of OTA in such a manner as to compensate for that deviation. In OTA, a cause for the deviation of gm from the desired value, that is, from the design assumption value is that β of a MOS transistor or a tail electric current ISS deviates from the design assumption value due to variations in the process, the power source voltage, the temperature of the surroundings and the like. At this point, β is one of the parameters indicating a characteristic of the MOS transistor, and when a channel width is W, a channel length is L, mobility is μ, and capacity of a gate oxide film per unit area is Cox, then β is given by the following expression.

$$\beta = (W/L) \cdot \mu \cdot Cox \quad (20)$$

Therefore, when it is assumed that a certain deviation occurs in gm of all the OTAs in FIG. 10, with the same reason, the deviation occurs in gm of OTA1 and OTA2 in FIG. 1 or FIG. 7, formed in the neighborhood within the same integrated circuit, at the same ratio.

In this manner, in a case where the transconductance value gm or the capacitance value C changes due to the variations in the IC manufacturing process and the variations in power source voltage, the temperature, and the like, the transconductance adjustment circuit 100 and the complex BPF circuit 200 vary in center frequency in a similar manner. Moreover, the center frequency of transconductance adjustment circuit 100 and the center frequency of complex BPF circuit 200 may not be the same.

Moreover, the replica circuit 110 of the transconductance adjustment circuit 100 is not limited to the first complex BPF, but may be a second or later complex BPF. Furthermore, like the complex BPF circuit 200 in FIG. 10, the replica circuit 110 may be configured from an entire differential circuit.

Figure 11:
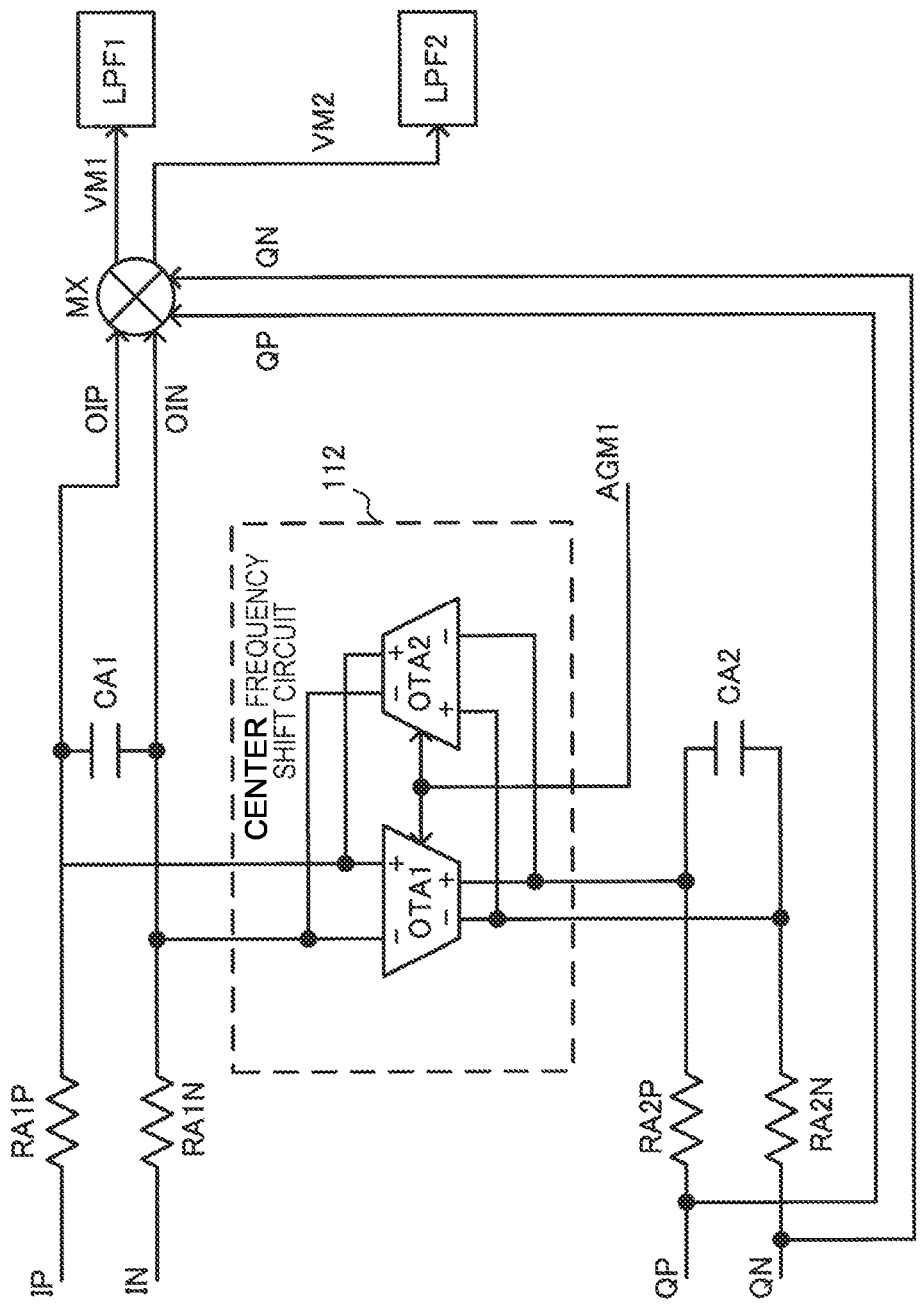
FIG. 11 is a diagram illustrating a configuration example in which the replica circuit is configured from an entire differential circuit.

FIG. 11 illustrates a configuration example in which the replica circuit 110 (the first complex BPF) of the transconductance adjustment circuit 100 is configured from the entire differential circuit. The center frequency shifting circuit 112 is configured from one pair of entire differential type OTAs. The frequency characteristic may be shifted by the center frequency ω0 by connecting the low pass filters of the system of the first signals IP and IN and the low pass filters of the system of the second signals QP and QN via one pair of OTAs that are different in polarity from each other (one is positive in polarity and the other is negative in polarity). As a result, the band pass filter may be obtained.

Figure 12A:
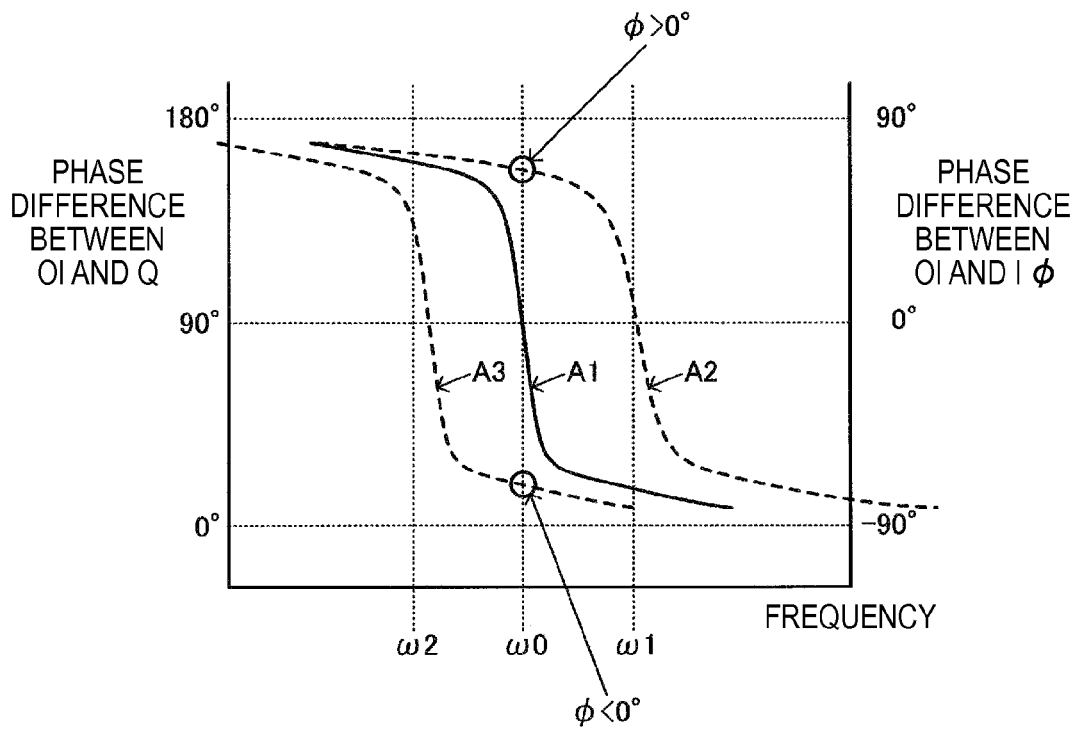
FIGS. 12A and 12B are graphs, each illustrating a deviation of a center frequency.
Figure 12B:
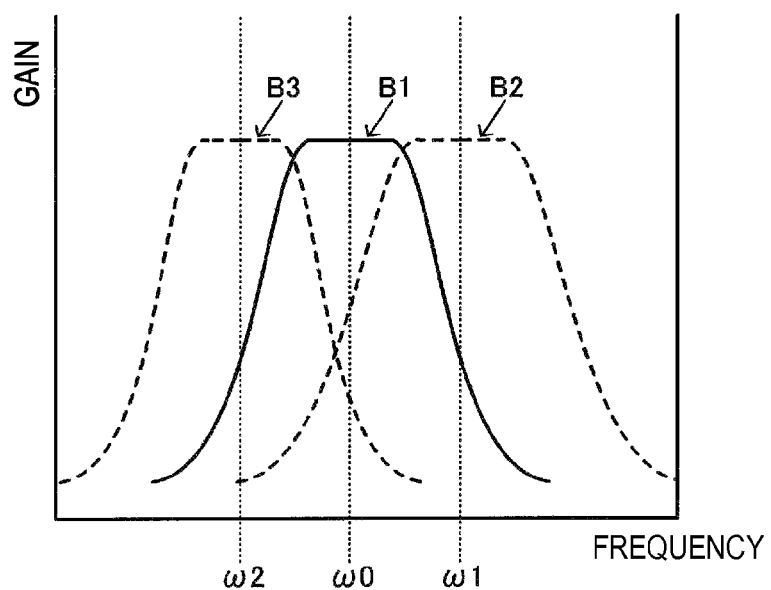

FIGS. 12A and 12B are graphs, each illustrating detection of a deviation of the center frequency by the transconductance adjustment circuit 100 according to the embodiment. FIG. 12A illustrates a relationship between the phase difference and the center frequency that the first output signal OI has with respect to the first and second signals I and Q in the replica circuit 110 of the transconductance adjustment circuit 100 (FIGS. 1A and 1B and FIG. 7). Furthermore, FIG. 12B illustrates the frequency characteristic of the complex BPF circuit 200 (for example, the fourth complex BPF). The design value (desired value) of the center frequency of the band pass filter is set to ω0.

In the replica circuit 110 (the first complex BPF) included in the transconductance adjustment circuit 100, as illustrated in FIG. 12A, the phase difference between the first output signal OI and the first signal I changes in a range from −90 degrees to 90 degrees. Although not illustrated, in a case where, for example, the complex BPF circuit 200 is the fourth complex BPF, phase difference changes in a range of −360 degrees to 360 degrees in a positive frequency domain.

In a case where the center frequency is consistent with the design value ω0, as indicated by A1 in FIG. 12A, the phase difference φ between the first output signal OI and the first signal I is 0 degree at a frequency ω0. Furthermore, because the phase of the second signal Q lags behind the first signal I by 90 degrees in a positive frequency domain, the phase difference of OI and Q is 90 degrees at the frequency ω0. The frequency characteristic of the gain of the complex BPF circuit 200 in this case becomes a characteristic indicated by B1 in FIG. 12B.

In a case where the center frequency changes to ω1 (ω1>ω0) due to the variations in the IC manufacturing process and the like, for example, as indicated by A2 in FIG. 12A, the phase difference φ between OI and I is greater than 0, or the phase difference between OI and Q is greater than 90 degrees, at the frequency ω0. The frequency characteristic of the gain of the complex BPF circuit 200 in this case becomes a characteristic indicated by B2 in FIG. 12B.

Furthermore, in a case where the center frequency changes to ω2 (ω2<ω0) due to the variations in the IC manufacturing process and the like, for example, as indicated by A3 in FIG. 12A, the phase difference φ between OI and I is smaller than 0 degree, or the phase difference between OI and Q is smaller than 90 degrees, at the frequency ω0. The frequency characteristic of the complex BPF circuit 200 in this case becomes a characteristic indicated by B3 in FIG. 12B.

Therefore, the first and second signals I and Q of the frequency ω0 to the replica circuit 110 of the transconductance adjustment circuit 100 can be input, and it can be estimated whether or not the center frequency of the complex BPF circuit 200 is consistent with the design value ω0, and whether or not the two cutoff frequencies ωH and ωL of the complex BPF circuit 200 are consistent with the design value, based on the output signals VA1 and VA2 of the smoothing circuits LPF1 and LPF2 or on the differential signal electric current ID of the differential signal generation circuit 130.

The complex BPF circuit 200 and the transconductance adjustment circuit 100 are formed within the same IC chip. For this reason, the cause of the change in the center frequency of the complex BPF circuit 200 and the two cutoff frequencies ωH and ωL (the process variation, the power source voltage variation, and the temperature of the surroundings) are consistent with the cause of the change in the center frequency of the replica circuit 110 included in the transconductance adjustment circuit (the process variation, the power source voltage variation, and the variation in the temperature of the surroundings).

Based on these facts, in the transconductance adjustment circuit 100 according to the embodiment, instead of detecting the variation in the center frequency and the variation in the cutoff frequency in the adjustment-targeted circuit (the complex BPF circuit) 200, gm values of all OTAs included in the replica circuit 110 and the adjustment-targeted circuit 200 may be adjusted in such a manner as to approach the design value, by detecting the variation in the center frequency of the replica circuit (the first complex BPF) 110 included in the transconductance adjustment circuit 100 and based on the result of this detection.

Specifically, when the difference VA1-VA2 (FIG. 4) of the output signal of the smoothing circuit or the differential signal electric current ID (FIG. 9) is 0, it is determined that the center frequency and the two cutoff frequencies ωH and ωL are consistent with the design value. When VA1-VA2 or ID is negative (that is, φ>0), it is determined that the center frequency deviates to a higher degree than ω0, and when VA1-VA2 or ID is positive (that is, φ<0), it is determined that the center frequency deviates to a lower degree than ω0.

Moreover, although not illustrated, also the phase difference that the second output signal OQ has with respect to the second signal Q is the same as the phase difference that OI in FIG. 12A has with respect to I. Therefore, since the phase difference between OQ and I is 90 degrees at the center frequency ω0, also comparison with the phase difference between OQ and I may be provided. That is, OQ and I may be used as inputs to the mixer MX (or MX1).

As illustrated in Expression (8) or Expression (15), in a case where the difference VS1-VS2 of the integrated voltage or the integrated voltage VS is negative, since the compensation electric current ICR becomes negative, adjustment is performed to decrease the transconductance (gm). As gm is decreased, the center frequency (=gm/C) becomes low and approaches the design value ω0. On the other hand, in a case where the difference VS1-VS2 of the integrated voltage or the integrated voltage VS is positive, because the compensation electric current ICR becomes positive, adjustment is performed to increase the transconductance (gm). As gm is increased, the center frequency becomes high and approaches the design value ω0. Then, in a case where the center frequency is consistent with the design value ω0, the difference VA1-VA2 of the output signal of the smoothing circuit or the differential signal electric current ID is 0, because the difference VS1-VS2 of the integrated voltage or the integrated voltage VS is held as a constant voltage since then, gm is also held as a constant value.

Moreover, how gm of OTA is adjusted by the transconductance adjustment signal AGM is described below.

As described above, because the adjustment of transconductance is performed not only on OTA included in the replica circuit 110, but also on OTA included in the adjustment-targeted circuit 200, the center frequency of the adjustment-targeted circuit 200 and the two cutoff frequencies ωH and cot, is compensated to get the design value. Because there is a relationship, expressed as ω0=gm/C, as described above, the center frequency, including the variation in the capacitance value C of the capacitor may be compensated by adjusting gm. For example, in a case where the capacitance value C changes by k times the design value, the center frequency may be compensated to get the design value by adjusting gm value by k times the design value.

Furthermore, when a product of the inductance of the inductor equivalent circuits X1 to X4 (FIG. 10), and the capacitance values of the adjacent capacitors C1a, C3a, C1b, and C3b is held as a predetermined design value, the characteristic of adjustment-targeted circuit (the complex BPF circuit) 200 is held. For example, in a case where the inductance value of the X1 (L2a) is set to LL2a, and the capacitance values of the adjacent capacitors C1a and C3a are set to CC1a and CC3, a product LL2a×CC1a and LL2a×CC3a of the inductance value and the capacitance value is held as the predetermined design value, the characteristic of complex BPF circuit 200 is held. At this point, as described above, since there is a relationship expressed as $LL2a = CC2a/gm^2$, the following Expressions hold.

$$LL2a \times CC1a = CC2a \times CC1a/gm^2 \qquad (21)$$

$$LL2a \times CC3a = CC2a \times CC3a/gm^2 \qquad (22)$$

As understood from Expressions described above, also in a case where capacitance value changes by k times the design value, the product of the inductance value and the capacitance value may be held as the constant value, by adjusting the gm value by k times the design value.

In this manner, in the transconductance adjustment circuit 100 according to the embodiment, instead of directly detecting the deviation of the center frequency of the complex BPF circuit (the adjustment-targeted circuit in a broad sense) 200 from the design value, the deviation of the center frequency and the transmission characteristic (the cutoff frequency and the like) from the design value may be compensated for, by detecting the phase difference of the first complex BPF (the replica circuit in a broad sense) 110 and adjusting the transconductance of OTA based on the result of that detection. As a result, in a case where the transconductance adjustment circuit according to the embodiment is used in a wireless device and the like, robust wireless communication may be realized in a more stable manner, because the deviation of the center frequency and the transmission characteristic from the design value due to the variations in the IC manufacturing process and the variations in power source voltage and temperature and the like, can be compensated for, for example, before starting the wireless communication, or during the wireless communication.

Figure 13:
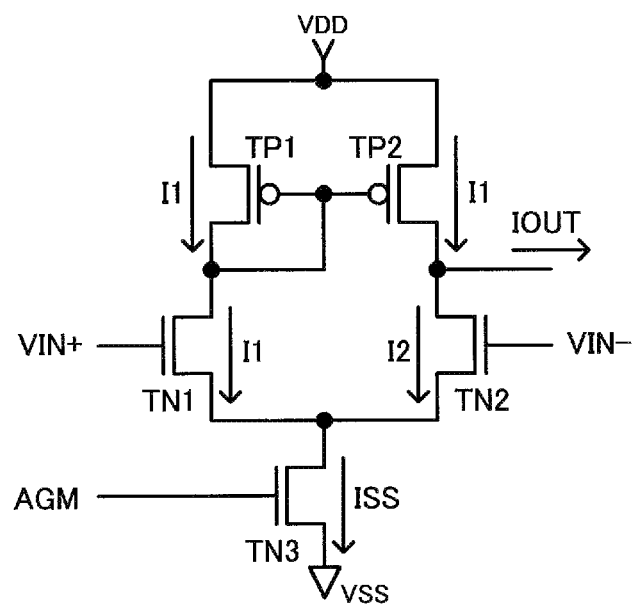
FIG. 13 is a diagram illustrating a first configuration example of an operational transconductance amplifier.

FIG. 13 illustrates a first configuration example of the operational transconductance amplifier (OTA). Moreover, OTA according to the embodiment is not limited to the configuration in FIG. 13, and various modifications are possible, such as omission of one part of the constituent element thereof, replacement with another constituent element, and addition of another constituent element.

The first configuration example of OTA illustrated in FIG. 13 includes N type transistors TN1, TN2, and TN3, and P type transistors TP1 and TP2. A gate of TN1 is connected to a non-inversion input terminal VIN+, and a gate of TN2 is connected to an inversion input terminal VIN−. TP1 and TP2 make up a current mirror circuit. A drain of TN1, a drain and the gate of TP1, and the gate of TP2 are commonly connected. Furthermore, the drain of TN2 and the drain of TP2 are commonly connected, and additionally are connected to an electric current output terminal IOUT. TN3 operates as a current source of a tail electric current ISS. An electric current value of the tail electric current ISS is adjusted by a gate bias voltage being adjusted by a transconductance adjustment signal AGM to be input to the gate.

Since TN3 and TN4 of an electric current addition circuit 160 (FIG. 4 and FIG. 9) make up the current mirror circuit, a electric current value of a drain electric current (the tail electric current ISS) of TN3 is proportional to an electric current value of a drain electric current (ICR+IREF) of TN4. This proportionality factor is determined by the size of TN3 and TN4. For example, when channel lengths of TN3 and TN4 are the same, a channel width ratio is established. When this is done, the electric current value of the tail electric current ISS of OTA is set in such a manner as to be in proportion to ICR+IREF.

A transconductance gm of OTA is expressed by the following expression, using the tail electric current ISS.

$$gm = \sqrt{\beta \cdot ISS} \quad (23)$$

In the expression, β denotes a characteristic parameter of TN1 and TN2 given by Expression (20). Expression (23) derives from a publicly-known literature, for example, Kenji Taniguchi, "A Guide to CMOS Analog Circuit 4th ed." CQ, Aug. 1, 2006, pp. 101-103.

As understood from Expression (23), gm of OTA can be adjusted by adjusting the tail electric current ISS. As described above, since TN4 (FIG. 4 and FIG. 9) that is included in the electric current addition circuit 160 and TN3 of the tail electric current source make up the current mirror circuit, the tail electric current ISS may be obtained that is in proportion to a drain electric current Ids=ICR+IREF of TN4.

Figure 14:
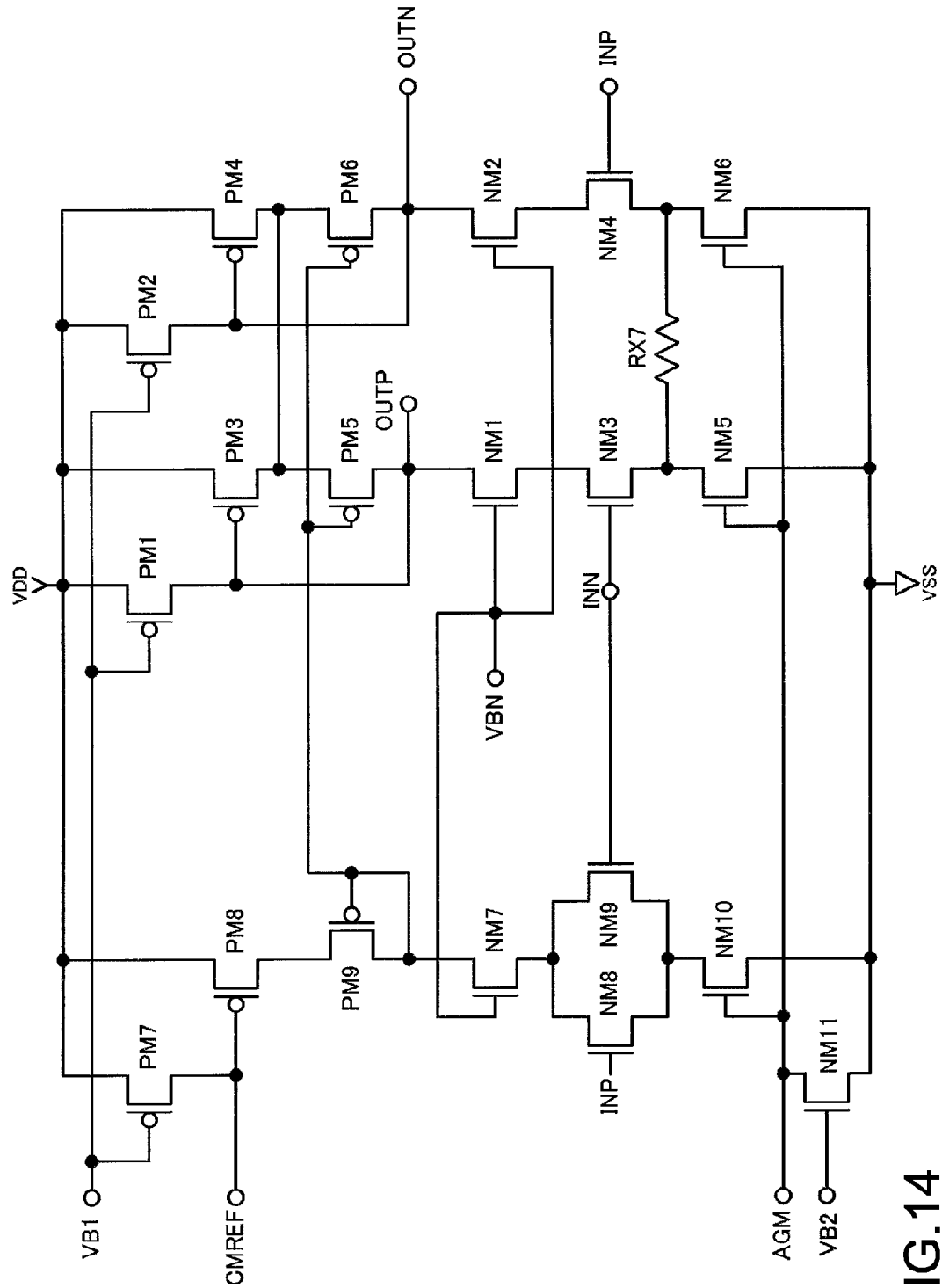
FIG. 14 is a diagram illustrating a second configuration example of the operational transconductance amplifier.

FIG. 14 illustrates a second configuration example of the operational transconductance amplifier (OTA). Moreover, OTA according to the embodiment is not limited to the configuration in FIG. 14, and various modifications are possible, such as omission of one part of the constituent element thereof, replacement with another constituent element, and addition of another constituent element.

In the second configuration example of OTA illustrated in FIG. 14, N type transistors NM3 and NM4 make up an input differential pair of OTAs, and gates are connected to input terminals INN and INP, respectively. P type transistor PM5 and PM6 make up a load electric current source, and drains are connected to output terminals OUTP and OUTN, respectively. In N type transistors NM1 and NM2, a bias voltage VBN is applied to each gate, and the N type transistors NM1 and NM2 is cascode-connected to the NM3 and NM4, respectively. The NM1 and the NM2 increase output impedance of OTA, and performs a function of decreasing an influence of a variation in the load. N type transistors NM5 and NM6 make up the tail electric current source, and the tail electric current of OTA is adjusted by the transconductance adjustment signal AGM that is input to each gate.

P type transistors PM3, PM4, and PM8 are transistors for common feedback, and performs a function of stabilizing a direct current potential of an operating point of OTA. Furthermore, a P type transistor PM9 and N type transistors NM7, NM8, and NM9 make up a bias voltage generation circuit, and generate a gate bias voltage of load electric current sources PM5 and PM6.

Figure 15:
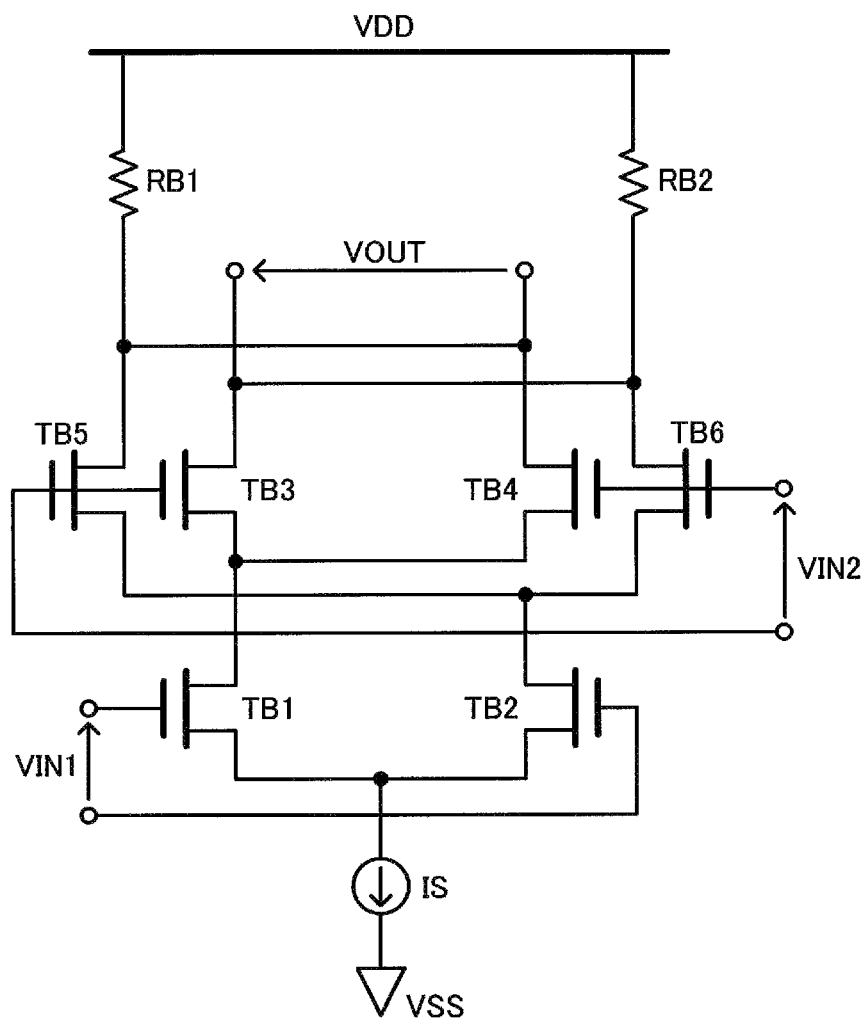
FIG. 15 is a diagram illustrating a configuration example of a mixer.

FIG. 15 illustrates a configuration example of mixers MX, MX1, and MX2. Moreover, the mixers MX, MX1, and MX2 according to the embodiment is not limited to the configuration in FIG. 15, and various modifications are possible, such as omission of one part of the constituent element thereof, replacement with another constituent element, and addition of another constituent element.

The configuration example of the mixer illustrated in FIG. 15 includes N type transistors TB1 to TB6, resistor elements RB1 and RB2, and an electric current source IS. An input signal VIN1 is input to each of TB1 and TB2, and an input signal VIN2 is input to each gate of the TB3 to TB6. An output signal VOUT is output from a common connection node of each drain of TB3 and TB6, and a common connection node of each drain of TB4 and TB5.

Figure 16A:
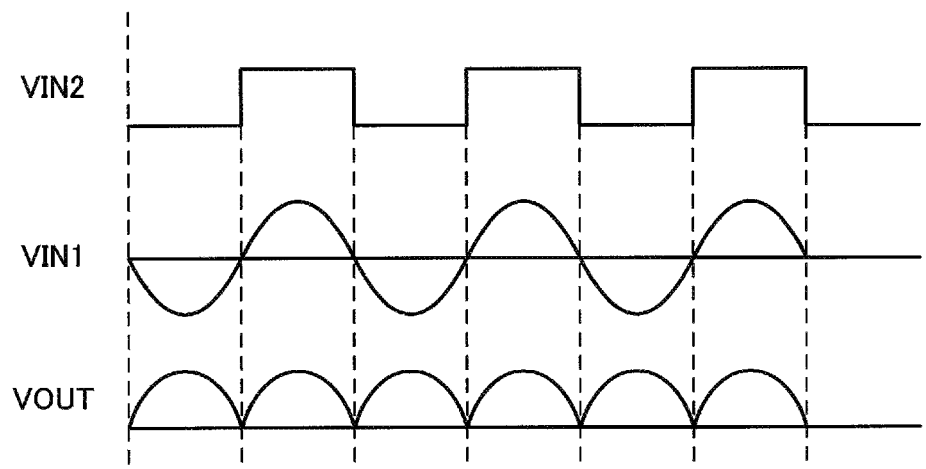
FIGS. 16A and 16B are diagrams, each illustrating a signal waveform of operation of the mixer.
Figure 16B:
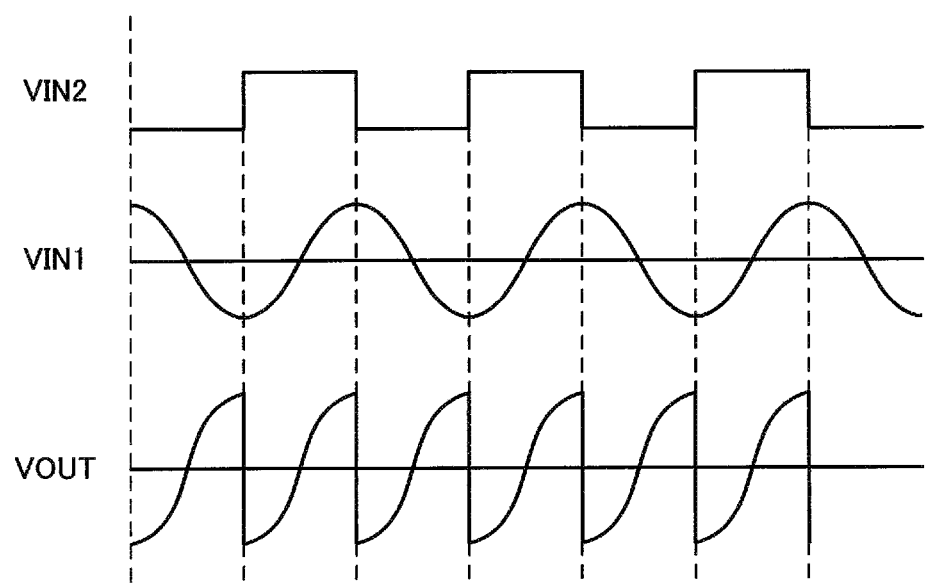

FIGS. 16A and 16B each illustrate a signal waveform that describes operation of the mixer illustrated in FIG. 15. FIG. 16A illustrates a signal waveform in a case where two input signal VIN1 and VIN2 are in the same phase. In this case, the output signal VOUT has a waveform on the positive side (on the + side) with respect to a common electric potential VCOM. On the other hand, in a case where VIN1 and VIN have a phase difference of 90 degrees, as illustrated in FIG. 16B, the output signal VOUT has a waveform that holds a part of the positive side (on the + side) and a part of the negative side (on the − side) with respect to the common electric potential VCOM.

For example, in a case where the input signal VIN1 is set to a second signal Q (sin(ωt)), and the input signal VIN2 is set to a first output signal OI (cos(ωt+φ)), the output signal VOUT is k×(sin(2ωt+φ)−sin φ). By the smoothing circuit LPF smoothing the output signal VOUT, a direct current component (−k·sin φ) in the second part of the expression described above may be taken out. The cutoff frequency of the smoothing circuit LPF needs to be set to between 0 and 2ω, and preferably is close to 0, but within a range of an area occupied by a capacitor and a resistor element that make up the smoothing circuit.

In this manner, the direct current signal according to the phase difference between the two signals that are input to the mixer may be generated by taking out the direct current component of the output signal of the mixer. In a case where the phase difference is 90 degrees, the direct current signal is set to 0V, and otherwise, the phase difference becomes positive or negative.

Figure 17:
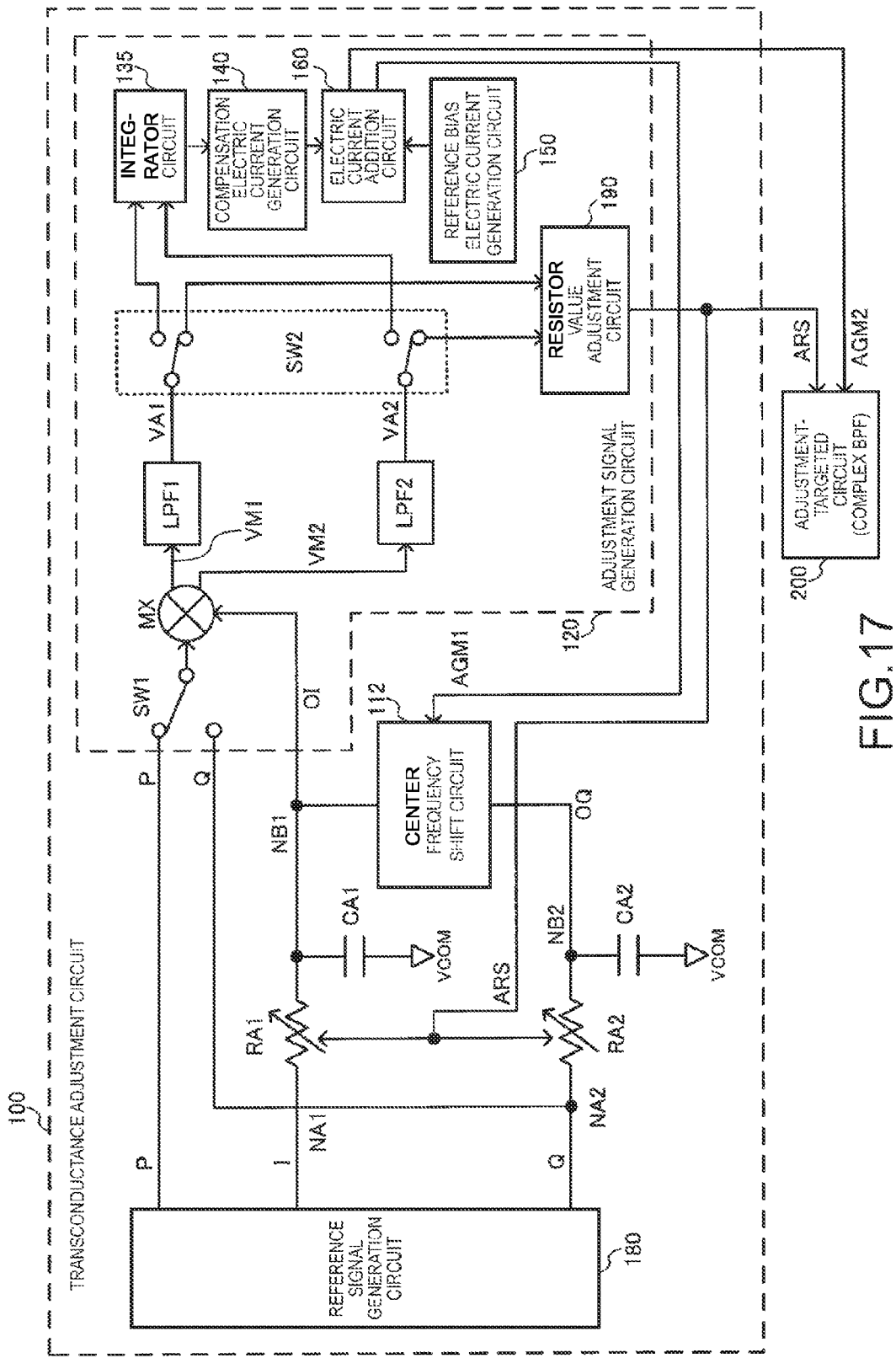
FIG. 17 is a diagram illustrating a third configuration example of the transconductance adjustment circuit.

FIG. 17 is a third configuration example of the transconductance adjustment circuit 100 according to the embodiment. The adjustment signal generation circuit 120 in a third configuration example further includes first and second switch elements SW1 and SW2, and a resistor value adjustment circuit 190, in addition to the first configuration example (FIG. 3) described above.

A reference signal generation circuit 180 outputs first and second signals I and Q and a third signal P that is different in phase from 1 and Q. Specifically, the third signal P is a signal that advances by 45 degrees or is delayed by 45 degrees in phase with respect I.

The adjustment signal generation circuit 120 outputs a signal ARS that adjusts the resistor value with a first resistor element RA1, a second resistor element RA2, and an adjustment-targeted circuit (a complex BPF circuit) 200, based on the third signal P and the first output signal OI, or based on the third signal P and the second output signal OQ. Specifically, for example, each resistor value of the resistor elements R1*a* to R1*d* and R2*a* to R2*d*, which are included in the complex BPF circuit 200 illustrated in FIG. 10, is adjusted by the signal (resistor value adjustment signal) ARS that adjusts the resistor value.

The first switch element SW1 switches one input signal of the mixer MX. Furthermore, the second switch element SW2 switches output destinations of the smoothing circuits LPF1 and LPF2. Specifically, in an operational mode in which the compensation is performed on the center frequency described above, the second signal Q is selected as one input signal of the mixer MX by SW1, the integrator circuit 135 is selected as the output destination of the output signals VA1 and VA2 of the smoothing circuits LPF1 and LPF2 by SW2. Furthermore, in a mode in which the compensation is performed on a bandwidth described below, the third signal P is selected as one input signal of the mixer MX by SW1, the resistor value adjustment circuit 190 is selected as the output destination of the output signals VA1 and VA2 of the smoothing circuits LPF1 and LPF2 by SW2.

The resistor value adjustment circuit 190 outputs a resistor value adjustment signal ARS with respect to the first and second resistor elements RA1 and RA2, and the adjustment-targeted circuit (the complex BPF circuit) 200, based on the output signals VA1 and VA2.

In the transconductance adjustment circuit 100 in the third configuration example, for example, the bandwidth of the replica circuit 110 (the first complex BPF circuit) of the transconductance adjustment circuit 100, that is, two (high frequency side and low frequency side) cutoff frequencies ωH and ωL can be compensated to have the design value (the desired value), by adjusting the resistor values of the resistor elements RA1 and RA2, for example, based on the third signal P and the first output signal OI. At this point, a cause of variation in the bandwidth of the first complex BPF circuit can be changed by the processes of the resistor elements RA1 and RA2 that are configured from passive elements, the power source voltage and the temperature.

The complex BPF circuit 200 illustrated in FIG. 10 includes passive resistors R1*a* to R1*d* and R2*a* to R2*d*. The passive resistor is configured form the same structure and the same material as the passive resistors RA1 and RA2 of the first complex BPF circuit in FIG. 17. The passive resistor formed from the same structure and the same material presents the same characteristic variation due to the same variation source (the process variation, the power source voltage variation, and the temperature variation) as the characteristic variation of the first complex BPF circuit. Therefore, the characteristic of the complex BPF circuit 200 can be compensated in such a manner as to be close to the design value, by detecting the variation in the bandwidth of the first complex BPF circuit 110 and adjusting the passive resistor value included in the first complex BPF circuit 110 and the complex BPF circuit 200.

Figure 18A:
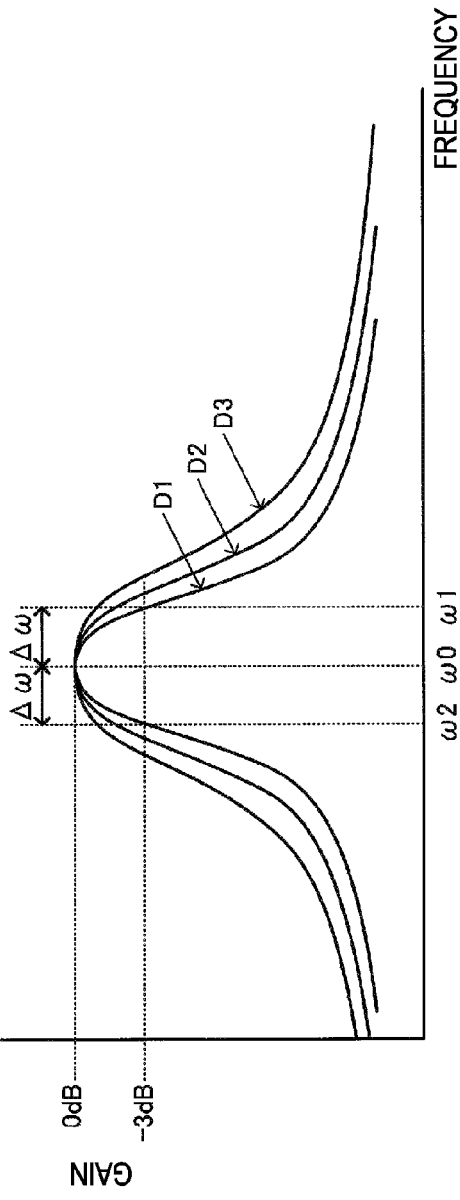
FIGS. 18A and 18B are graphs, each illustrating compensation of a bandwidth of the complex BPF circuit in the third configuration example.
Figure 18B:
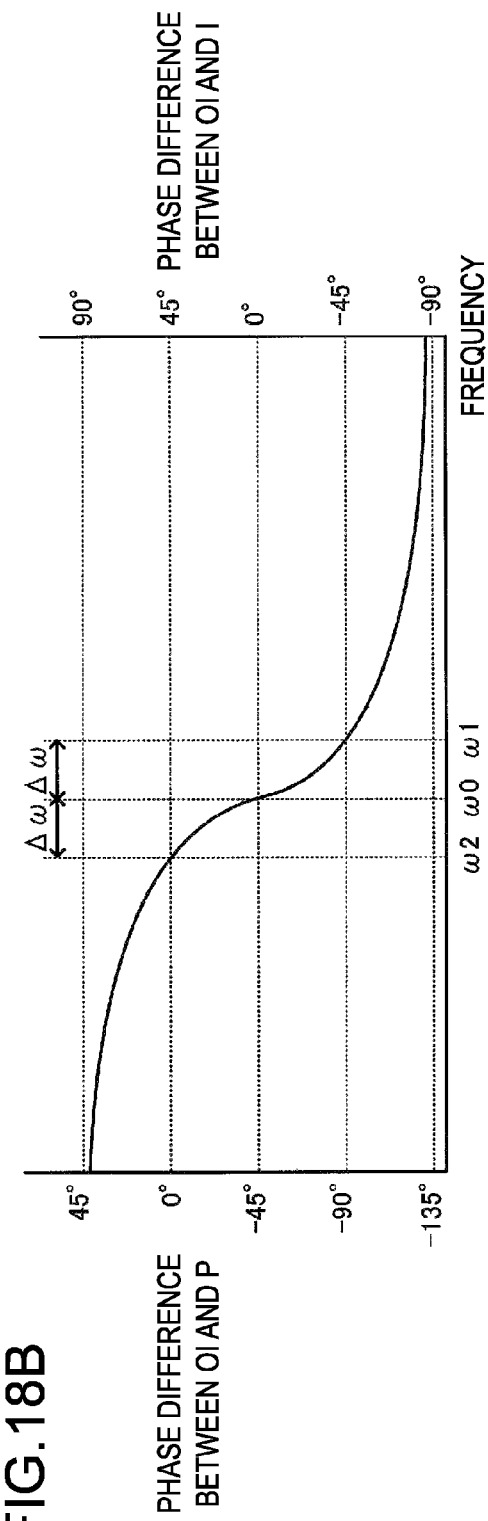

FIGS. 18A and 18B are graphs each illustrating the compensation of the bandwidth of the complex BPF circuit in the third configuration example. For example, the frequency characteristic indicated by D1 in FIG. 18A is assumed to be a desired frequency characteristic. When the frequencies (the cutoff frequency) that are attenuated by 3 dB from a gain (a maximum gain) in the center frequency ω0 are ω1 and ω2, ω1−ω2=2×Δω gives the bandwidth.

The bandwidth is determined depending on the resistor value of each resistor element of the first complex BPF circuit, and is denoted by the following expression.

$$\omega1-\omega2=2/(CA1 \times RA1) \qquad (24)$$

Therefore, even though the resistor value of each resistor element is set at the time of design in such a manner as to be a desired bandwidth, the bandwidth changes when the resistor value changes due to the variations in the IC manufacturing process, and the variations in power source voltage and the temperature of the surroundings. For example, when RA1 changes in the direction of being smaller than the design value, the bandwidth is broadened, as indicated by D2 and D3 in FIG. 18A.

As illustrated in FIG. 18B, the phase difference that the first output signal OI has with respect to the first signal I is −45 degrees in the cutoff frequency ω1, and is +45 degrees in the cutoff frequency ω2. For example, when the signal that advances by 45 degrees in phase with respect to I as the third signal P, the phase change with respect to P of OI is −90 degrees in ω1. Although not illustrated, when the signal that is delayed by 45 degrees in phase with respect to I as the third signal P is input, the phase change with respect to P of OI is 90 degrees in ω2.

In this manner, the signal, which is delayed by 45 degrees in phase, or advances by 45 degrees with respect to I as the third signal P, may be input and the frequency that has the phase difference of 90 degrees or −90 degrees with respect to P of OI may be detected by the mixer MX, the smoothing circuits LPF1 and LPF2.

Specifically, three signals I, Q, and P of the frequency ω1 or ω2 are input from the reference signal generation circuit 180, and the resistor adjustment circuit 190 changes the resistor value of each resistor element with the resistor value adjustment signal ARS, and sets the resistor value in such a manner that the phase change becomes the closest to 90 degrees or −90 degrees. When this is done, the resistor value adjustment circuit 190 can adjust the resistor value of each resistor element in such a manner that the cutoff frequency is consistent with the desired value (the design value).

In order to adjust the resistor value of the resistor element, for example, the multiple passive resistor elements that use a polysilicon thin film and the like may be provided, and a selection circuit may select one or more of the resistor elements of the provided resistor elements, thereby making an electric connection. The resistor adjustment signal ARS in this case is a signal which controls the selection circuitry.

Moreover, in order to detect the cutoff frequencies ω1 and ω2 using the third signal P and the second output signal OQ, the signal may be input that is delayed by 45 degrees or advances by 45 degrees in phase with respect to Q as the third signal P.

In FIGS. 18A and 18B, the frequency in which the difference in phase between OI and I is −45 or 45 degrees is illustrated as the cutoff frequencies ω1 and ω2, but other phase differences may be allowed. For example, the phase difference may be −40 degrees or 40 degrees. In this case, the third signal P may be a signal that advances by 40 degrees or is delayed by 40 degrees with respect to I.

As described above, in the transconductance adjustment circuit 100 according to the embodiment, and the deviation of the center frequency from the design value may be compensated for with high precision, by detecting the deviation of the center frequency of the replica circuit (the first complex BPF circuit) 110 included in the transconductance adjustment circuit 100, from the design value, and by adjusting the transconductance of OTA based on a result of the detection. At the same time, the deviation of the center frequency of the complex BPF circuit (the adjustment-targeted circuit in a broad sense) 200 and the cutoff frequency from the design value can be compensated for with high precision. As a result, in a case where the transconductance adjustment circuit according to the embodiment is used in a wireless device and the like, the deviation of the center frequency from the design value due to the variations in the IC manufacturing process and the variations in power source voltage and temperature and the like, can be compensated for, for example, before starting the wireless communication, or during the wireless communication.

Furthermore, since the characteristic that specifies the bandwidth of the complex BPF circuit, such as the cutoff frequency can be detected and thus the resistor value of the resistor element can be adjusted based on the result of the detection, the deviation of the bandwidth from the design value due to the variations in the IC manufacturing process can be compensated for. As a result, it is possible to realize robust wireless communication in a more stable manner. In the case of the third configuration example illustrated in FIG. 17, specifically, for example, it is convenient to perform the adjustment of the passive resistor before starting the wireless communication and perform the adjustment of the transconductance gm of OTA during the wireless communication.

3. Circuit Device

Figure 19:
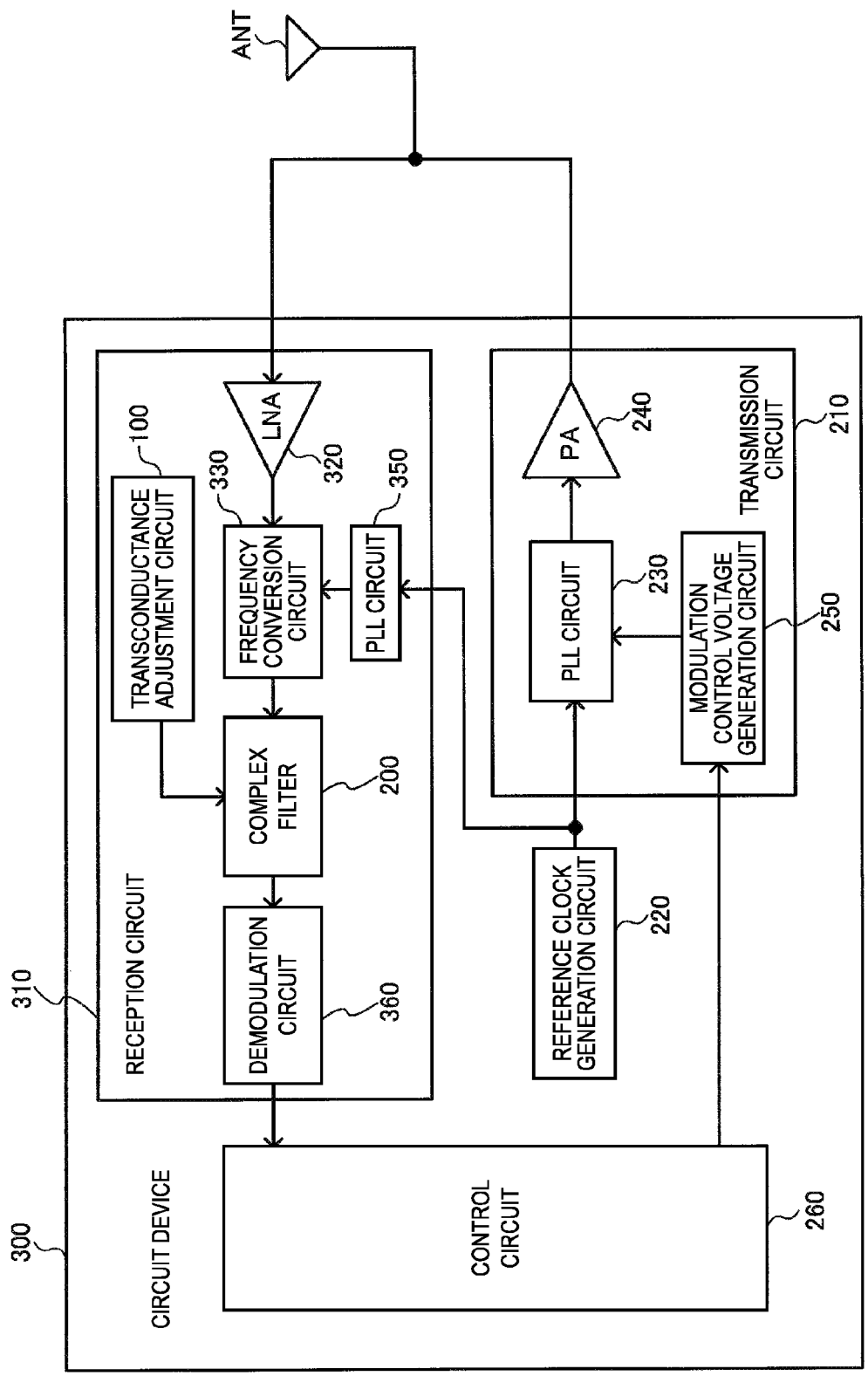
FIG. 19 is a diagram illustrating a configuration example of a circuit device.

FIG. 19 illustrates a configuration example of a circuit device (for example, a wireless communication LSI) 300 including a transconductance adjustment circuit 100 and a complex BPF circuit (an adjustment-targed circuit in a broad sense) 200 according to the embodiment. The circuit device 300 includes a transmission circuit 210, a reception circuit 310, a reference clock generation circuit 220, and a control circuit 260. The transmission circuit 210 includes a transmission phase-locked loop (PLL) circuit 230, a modulation control voltage generation circuit 250, and a power amplifier (PA) 240. The reception circuit 310 includes a low noise amplifier (LNA) 320, a frequency conversion circuit 330, a reception PLL circuit 350, a complex BPF circuit 200, a transconductance adjustment circuit 100, and a demodulation circuit 360. The transmission PLL circuit 230 generates a signal of a frequency of a carrier wave, based on a reference clock from the reference clock generation circuit 220. The modulation control voltage generation circuit 250 generates a modulation control voltage signal, based on transmission data from the control circuit 260, and outputs the result to the transmission PLL circuit 230. The power amplifier (PA) 240 amplifies an output signal of the transmission PLL circuit 230, and supplies the result to an antenna ANT.

The reference clock generation circuit 220 generates a reference clock, and outputs it to the transmission PLL circuit 230 and the reception PLL circuit 350.

The low noise amplifier (LNA) 320 amplifies a reception signal, input from the antenna ANT. The frequency conversion circuit 330 performs a frequency conversion from a reception frequency to an intermediate frequency. The complex BPF circuit 200 removes an unnecessary frequency component from the signal that goes through frequency conversion, and thus outputs a desired signal. The transmission PLL circuit 350 generates a signal of a local frequency, based on the reference clock from the reference clock generation circuit 220 and outputs the result to the frequency conversion circuit 330. The demodulation circuit 360 demodulates a signal of a desired wave and thus takes out necessary data. The transconductance adjustment circuit 100 performs adjustment on the transconductance of the complex BPF circuit 200 and the like, as described above.

The control circuit 260 performs transmission and reception control processing and performs data communication with an external circuit (a host and the like) of the circuit device 300. Specifically, the control circuit 260 performs carrier frequency setting processing, modulation processing, and demodulation processing.

As described above, in the transconductance adjustment circuit 100 and the complex BPF circuit 200 according to the embodiment, the deviation of the center frequency of the complex BPF circuit 200 from the design value may be compensated for with high precision, by detecting the deviation of the center frequency of the replica circuit (the first complex BPF circuit) 110 included in the transconductance adjustment circuit 100, from the design value, and by adjusting the transconductance of OTA based on a result of the detection. As a result, the deviation of the center frequency from the design value due to the variations in the IC manufacturing process, and the variations in power source voltage and temperature and the like, can be compensated for, for example, before starting the wireless communication, or during the wireless communication. Furthermore, since the characteristic that specifies the bandwidth of the first complex BPF circuit, such as the cutoff frequency can be detected and thus the resistor value of the resistor element included in the complex BPF circuit 200 can be adjusted based on the result of the detection, the deviation of the bandwidth from the design value due to the variations in the IC manufacturing process can be compensated for. As a result, it is possible to realize the robust wireless communication in a more stable manner.

4. Electronic Apparatus

Figure 20:
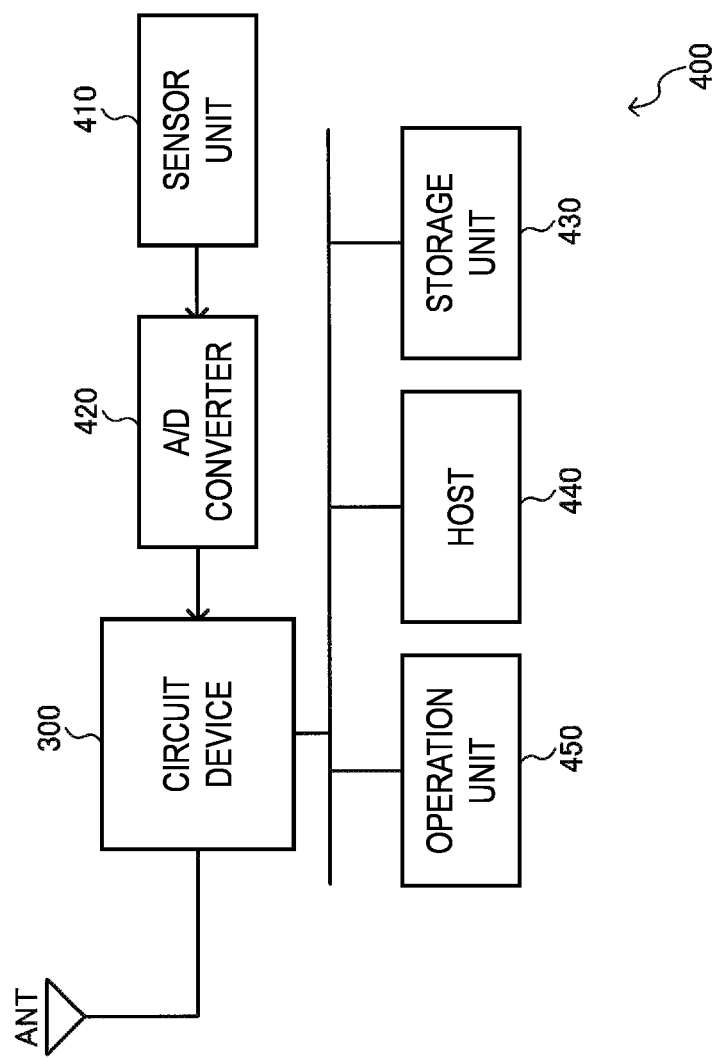
FIG. 20 is a diagram illustrating a configuration example of an electronic apparatus.

FIG. 20 illustrates a configuration example of an electronic apparatus 400 including the circuit device 300 according to the invention. The electronic apparatus 400 according to the embodiment includes a circuit device 300, a sensor unit 410, an A/D converter 420, a storage unit 430, a host 440, and a control unit 450.

The electronic apparatus 400 includes for example, a temperature and humidity meter, a pulse meter, a pedometer and the like, and can transmit the detected data by wireless. The sensor unit 410 includes a temperature sensor, a moisture sensor, a gyro sensor, an acceleration sensor, a photo sensor, a pressure sensor, and the sensor that is according to the use of the electronic apparatus 400 is used. The sensor part 410 amplifies an output signal (sensor signal) of the sensor, and removes a noise with a filter. The A/D converter 420 converts the amplified signal to a digital signal, and outputs the result to the circuit device 300. The host 440 is configured, for example, from a microcomputer and the like, and performs control processing on the electronic apparatus 400, based on digital signal processing, or on setting information stored in the storage unit 430 and the signal from the operation unit 450. The storage unit 430 is configured, for example, from a flash memory and the like, and stores the setting information, the detected data, and the like. The operation unit 450 is configured, for example, from a keypad and the like, and is used by an operator to operate the electronic apparatus 400.

Moreover, the description is provided in detail according to the embodiment, but a person of ordinary skill in the art can easily understand that many modifications not substantially deviating from new matters or effects according to the invention are possible. Therefore, such modification examples are all included within a scope of the invention. For example, in the specification or the drawings, the terms that are described at least once together with different terms that have broader meaning or the same meaning can be exchanged with the different terms, in any place of the specification or the drawings. Furthermore, the configurations and operation of the transconductance adjustment circuit, the circuit device, and the electronic apparatus, are not limited to what are described according to the embodiment, and various modifications are possible.

What is claimed is:

1. A transconductance adjustment circuit comprising:
a reference signal generation circuit that outputs a first signal and a second signal that is different by 90 degrees in phase from the first signal;
a replica circuit receiving the first signal and the second signal from the reference signal generation circuit as input and which generates a first output signal and a second output signal that are shaped as sinusoidal waves, wherein the first signal and the second signal are shaped as square waves; and
an adjustment signal generation circuit that receives the first output signal from the replica circuit and the second signal from the reference signal generation circuit and outputs a transconductance adjustment signal to an adjustment-targeted circuit and the replica circuit, wherein the adjustment-targeted circuit is external to the transconductance adjustment circuit,
wherein the reference signal generation circuit generates the first signal and the second signal that change in voltage at between a first voltage level and a second voltage level, based on a clock signal, and outputs the generated first signal and second signal to the replica circuit.

2. The transconductance adjustment circuit according to claim 1,
wherein an amplitude of the first signal and an amplitude of the second signal are half or less of an amplitude of the clock signal.

3. The transconductance adjustment circuit according to claim 2,
wherein the reference signal generation circuit includes
a signal generation circuit that generates a first square wave signal to an n-th (n is an integer equal to or greater than 2) square wave signal that are different in phase, based on the clock signal, and
a voltage level conversion circuit, to which the first square wave signal to the n-th square wave signal are input, and which outputs the first signal and the second signal by performing conversion processing on a voltage level.

4. The transconductance adjustment circuit according to claim 3,
wherein the signal generation circuit includes
a divider that divides the clock signal to output a divided signal, and
a shift resister that outputs the first square wave signal to the n-th square wave signal by shifting the divided signal with the clock signal.

5. The transconductance adjustment circuit according to claim 3,
wherein the voltage level conversion circuit includes
a resistors chained circuit that generates the first voltage level and the second voltage level, and
a switch circuit which is turned on and turned off based on the first square wave signal to the n-th square wave signal, and which alternately selects the first voltage level and the second voltage level,
wherein the switch circuit generates and outputs the first signal and the second signal, by alternately selecting the first voltage level and the second voltage level.

6. The transconductance adjustment circuit according to claim 3,
wherein the voltage level conversion circuit includes
an attenuator that attenuates the first square wave signal to the n-th square wave signal to obtain attenuated signals, and
a level shift circuit that generates and outputs the first signal and the second signal, by shifting a voltage level of the attenuated signals.

7. The transconductance adjustment circuit according to claim 1,
wherein the adjustment-targeted circuit is a first complex band pass filter circuit, and
the replica circuit includes a second complex band pass filter circuit.

8. The transconductance adjustment circuit according to claim 1,
wherein the replica circuit includes
a first resistor element that is provided between a first input node to which the first signal is input and a first output node,
a second resistor element that is provided between a second input node to which the second signal is input and a second output node,
a first capacitor one terminal of which is connected to the first output node,
a second capacitor one terminal of which is connected to the second output node, and
a center frequency shift circuit that is configured from a pair of operational transconductance amplifiers provided between the first output node and the second output node.

9. The transconductance adjustment circuit according to claim 8,
wherein the adjustment signal generation circuit generates the transconductance adjustment signal, based on the second signal and the first output signal output from the first output node, or on the first signal and the second output signal output from the second output node, or on the first signal and the first output signal, or on the second signal and the second output signal.

10. The transconductance adjustment circuit according to claim 9,
wherein the adjustment signal generation circuit includes
a mixer to which the first signal and the second output signal are input, or the second signal and the first output signal are input,
a first smoothing circuit that smooths a first mixer output signal from the mixer,
a second smoothing circuit that smooths a second mixer output signal from the mixer,
an integrator circuit that integrates output signals of the first smoothing circuit and the second smoothing circuit to generate a first integrated voltage and a second integrated voltage,
a compensation electric current generation circuit that generates a compensation electric current based on the first integrated voltage and the second integrated voltage from the integrator circuit,
a reference bias electric current generation circuit that generates a reference bias electric current, and
an electric current addition circuit that adds the compensation electric current and the reference bias electric current, wherein the adjustment signal generation circuit outputs the transconductance adjustment signal, based on an electric current added by the electric current addition circuit.

11. The transconductance adjustment circuit according to claim 9,
wherein the adjustment signal generation circuit includes
a mixer to which the first signal and the second output signal are input, or the second signal and the first output signal are input,
a smoothing circuit that smooths an output of the mixer,
a differential signal generation circuit that generates a differential signal between an output signal of the smoothing circuit and a reference voltage signal,
an integrator circuit that integrates the differential signal from the differential signal generation circuit to generate an integrated voltage,
a compensation electric current generation circuit that generates a compensation electric current, based on the integrated voltage from the integrator circuit,
a reference bias electric current generation circuit that generates a reference bias electric current, and
an electric current addition circuit that adds the compensation electric current and the reference bias electric current,
wherein the adjustment signal generation circuit outputs the transconductance adjustment signal, based on an electric current added by the electric current addition circuit.

12. The transconductance adjustment circuit according to claim 8,
wherein the reference signal generation circuit outputs a third signal that is different in phase from the first signal and the second signal, and
wherein the adjustment signal generation circuit outputs a signal that adjusts a resistor value to the first resistor element, the second resistor element and the adjustment-targeted circuit, based on the third signal and the first output signal, or on the third signal and the second output signal.

13. A circuit device comprising the transconductance adjustment circuit according to claim 1, and
the adjustment-targeted circuit, such that the adjustment-targeted circuit is internal to the transconductance adjustment circuit.

14. A circuit device comprising the transconductance adjustment circuit according to claim 2, and
the adjustment-targeted circuit, such that the adjustment-targeted circuit is internal to the transconductance adjustment circuit.

15. A circuit device comprising the transconductance adjustment circuit according to claim 3, and
the adjustment-targeted circuit, such that the adjustment-targeted circuit is internal to the transconductance adjustment circuit.

16. The circuit device according to claim 13,
wherein the adjustment-targeted circuit is a complex band pass filter circuit that has an operational transconductance amplifier, and transconductance of the operational transconductance amplifier is adjusted based on the transconductance adjustment signal.

17. The circuit device according to claim 14,
wherein the adjustment-targeted circuit is a complex band pass filter circuit that has an operational transconductance amplifier, and transconductance of the operational transconductance amplifier is adjusted based on the transconductance adjustment signal.

18. The circuit device according to claim 15,
wherein the adjustment-targeted circuit is a complex band pass filter circuit that has an operational transconductance amplifier, and transconductance of the operational transconductance amplifier is adjusted based on the transconductance adjustment signal.

19. An electronic apparatus comprising the circuit device according to claim 13.

20. An electronic apparatus comprising the circuit device according to claim 16.

* * * * *